*(12)* United States Patent
Reznicek et al.

*(10)* Patent No.: US 11,018,188 B2
*(45)* Date of Patent: May 25, 2021

(54) THREE-DIMENSIONAL STACKABLE MULTI-LAYER CROSS-POINT MEMORY WITH BIPOLAR JUNCTION TRANSISTOR SELECTORS

(71) Applicant: International Business Machines Corporation, Armonk, NY (US)

(72) Inventors: Alexander Reznicek, Troy, NY (US); Bahman Hekmatshoartabari, White Plains, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/429,923

(22) Filed: Jun. 3, 2019

(65) Prior Publication Data

US 2020/0381480 A1    Dec. 3, 2020

(51) Int. Cl.
*H01L 27/24*    (2006.01)
*H01L 45/00*    (2006.01)
(Continued)

(52) U.S. Cl.
CPC .... *H01L 27/2481* (2013.01); *H01L 21/02532* (2013.01); *H01L 27/2445* (2013.01);
(Continued)

(58) Field of Classification Search
CPC ............... H01L 27/2481; H01L 27/226; H01L 27/2445; H01L 45/1233; H01L 45/16;
(Continued)

(56) References Cited

U.S. PATENT DOCUMENTS 4,857,479 A * 8/1989 McLaughlin ..... H01L 21/28531
                                                            438/348
6,777,773 B2    8/2004 Knall
(Continued)

FOREIGN PATENT DOCUMENTS

WO    2016085565 A1    6/2016

OTHER PUBLICATIONS

C.H. Wang et al., "Three-Dimensional 4F2 ReRAM Cell with CMOS Logic Compatible Process," IEEE International Electron Devices Meeting (IEDM), Dec. 6-8, 2010, 4 pages.
(Continued)

*Primary Examiner* — Sitaramarao S Yechuri
(74) *Attorney, Agent, or Firm* — L. Jeffrey Kelly; Ryan, Mason & Lewis, LLP

(57) ABSTRACT

A method for manufacturing a semiconductor memory device includes forming a first doped semiconductor layer on a conductive layer, forming a second doped semiconductor layer stacked on the first doped semiconductor layer, forming a third doped semiconductor layer stacked on the second doped semiconductor layer, and forming a memory stack layer on the third doped semiconductor layer. The memory stack layer and the first, second and third doped semiconductor layers are patterned into a plurality of pillars spaced apart from each other. In the method, a plurality of extrinsic base layers are formed adjacent the patterned second doped semiconductor layers. The patterned first, second and third doped semiconductor layers in each pillar of the plurality of pillars are components of a bipolar junction transistor device, and the plurality of pillars are parts of a memory cell array having a cross-point structure.

20 Claims, 30 Drawing Sheets

(51) Int. Cl.
*H01L 29/737* (2006.01)
*H01L 21/02* (2006.01)
*H01L 29/165* (2006.01)
*H01L 29/66* (2006.01)

(52) U.S. Cl.
CPC ...... *H01L 29/165* (2013.01); *H01L 29/66242* (2013.01); *H01L 29/737* (2013.01); *H01L 45/1233* (2013.01); *H01L 45/16* (2013.01)

(58) Field of Classification Search
CPC ................. H01L 29/737; H01L 29/165; H01L 29/66242; H01L 21/02532
See application file for complete search history.

(56) References Cited

U.S. PATENT DOCUMENTS

| | | | |
|---|---|---|---|
| 6,797,580 B1* | 9/2004 | Yin | H01L 21/8249 257/E21.371 |
| 7,834,338 B2* | 11/2010 | Herner | G11C 13/0007 257/2 |
| 8,623,697 B2 | 1/2014 | Magistretti et al. | |
| 8,988,926 B2 | 3/2015 | Pellizzer et al. | |
| 9,184,215 B2 | 11/2015 | Tan et al. | |
| 9,246,089 B2 | 1/2016 | Herner et al. | |
| 9,257,431 B2 | 2/2016 | Ravasio et al. | |
| 9,496,271 B2 | 11/2016 | Or-Bach et al. | |
| 9,577,010 B2 | 2/2017 | Sciarrillo | |
| 9,871,076 B2 | 1/2018 | Toh et al. | |
| 10,011,920 B2 | 7/2018 | Hekmatshoar-Tabari et al. | |
| 2001/0053088 A1* | 12/2001 | Forbes | H01L 27/0635 365/149 |
| 2007/0161173 A1* | 7/2007 | Kerr | H01L 29/66287 438/197 |
| 2009/0014836 A1 | 1/2009 | Lee et al. | |
| 2011/0169126 A1* | 7/2011 | Chen | H01L 45/06 257/528 |
| 2012/0145984 A1 | 6/2012 | Rabkin et al. | |
| 2012/0210932 A1 | 8/2012 | Hekmatshoar-Tabari et al. | |
| 2012/0289020 A1 | 11/2012 | Kim et al. | |
| 2012/0305879 A1 | 12/2012 | Lu et al. | |
| 2013/0126816 A1 | 5/2013 | Tang et al. | |
| 2013/0134383 A1 | 5/2013 | Hwang et al. | |
| 2013/0235654 A1* | 9/2013 | Rigano | H01L 27/2436 365/163 |
| 2013/0270501 A1 | 10/2013 | Toh et al. | |
| 2014/0284540 A1 | 9/2014 | Suguro | |
| 2015/0070965 A1 | 3/2015 | Bandyopadhyay et al. | |
| 2015/0137061 A1 | 5/2015 | Donghi et al. | |
| 2016/0190293 A1* | 6/2016 | Wu | H01L 29/1004 257/197 |
| 2017/0092748 A1 | 3/2017 | Ting et al. | |
| 2017/0148852 A1* | 5/2017 | Boniardi | H01L 27/2481 |
| 2017/0317139 A1* | 11/2017 | Seong | H01L 27/2427 |
| 2017/0365642 A1* | 12/2017 | Ravasio | H01L 45/1675 |
| 2018/0047707 A1 | 2/2018 | Or-Bach et al. | |
| 2018/0277521 A1 | 9/2018 | Or-Bach et al. | |
| 2019/0019947 A1* | 1/2019 | Gotti | H01L 45/1675 |

OTHER PUBLICATIONS

X.P. Wang et al., "Highly Compact 1T-1R Architecture (4F2 Footprint) Involving Fully CMOS Compatible Vertical GAA Nano-Pillar Transistors and Oxide-Based RRAM Cells Exhibiting Excellent NVM Properties and Ultra-Low Power Operation," IEEE International Electron Devices Meeting (IEDM), Dec. 10-13, 2012, 4 pages.

H. Wu et al., "RRAM Cross-Point Arrays," 3D Flash Memories, Chapter 8, May 2016, pp. 223-260.
S. Shah Rjerdi et al., "Low-Temperature Epitaxy of Compressively Strained Silicon Directly on Silicon Substrates," Journal of Electronic Materials, Mar. 2012, pp. 494-497, vol. 41, No. 3.
Y. Kim et al., "Three-Dimensional NAND Flash Architecture Design Based on Single-Crystalline STacked ARray," IEEE Transactions on Electron Devices, Jan. 2012, pp. 35-45, vol. 59, No. 1.
J.H. Oh et al., "Full Integration of Highly Manufacturable 512Mb PRAM Based on 90nm Technology," International Electron Devices Meeting (IEDM), Dec. 11-13, 2006, 4 pages.
J. Cai et al., "On the Device Design and Drive-Current Capability of SOI Lateral Bipolar Transistors," IEEE Journal of the Electron Devices Society, Sep. 2014, pp. 105-113, vol. 2, No. 5.
V.S.S. Srinivasan, et al., "Punchthrough-Diode-Based Bipolar RRAM Selector by Si Epitaxy", IEEE Electric Device Letters, Oct. 2012, vol. 33, No. 10.
M.H. Lee, et al., "Reliability of Ambipolar Switching Poly-Si Diodes for Cross-Point Memory Applications", Device Research Conference (DRC) 2011, 69th Annual.
S. H. Jo, et al., "CMOS Compatible Nanoscale Nonvolatile Resistance Switching Memory", Nano Letters, Feb. 2008, pp. 392-397, vol. 8, No. 2.
Y. Dong, et al., "Si/a-Si Core/Shell Nanowires as Nonvolatile Crossbar Switches", Nano Letters, Feb. 2008, pp. 386-391, vol. 8, No. 2.
Wikipedia, "3D XPoint," https://en.wikipedia.org/wiki/3D_XPoint, 2017, 3 pages.
Crossbar, "Crossbar ReRAM: Rethinking Simplicity.," https://www.crossbar-inc.com/en/technology/reram-overview/, 4 Pages.
G.W. Burr et al., "Access Devices for 3D Crosspoint Memory.," Journal of Vacuum Science & Technology B, Nanotechonology and Microelectronics: Materials, Processing, Measurement, and Phenomena, Jul./Aug. 2014, vol. 32, No. 4, 23 pages.
K. Suga et al., "P-3: The Effect of a Laser Annealing Ambient on the Morphology and TFT Performance of Poly-Si Films," Society for Information Display, vol. 31, No. 1, May 2000, pp. 534-537.
R. F. Wood et al., "Macroscopic Theory of Pulsed-Laser Annealing II. Dopant Diffusion and Segregation," The American Physical Society, vol. 23, No. 10, May 15, 1981, pp. 5555-5569.
K. Oh et al., "Bottom-Gate ELA Poly-Si TFT for High-Resolution AMOLED Mobile Displays," Society for Information Display, vol. 47, No. 1, May 22, 2016, pp. 923-926.
Y. Chen et al., "P-4: Fabrication of Extremely Low Roughness Polycrystalline Silicon and Its Correlation to Device Performance," Society for Information Display, vol. 34, No. 1, May 2003, pp. 216-219.
D. Shahrjerdi et al., "Low-Temperature Epitaxy of Compressively Strained Silicon Directly on Silicon Substrates," Journal of Electronic Materials, vol. 41, No. 3, 2012, pp. 494-497.
F. Carta et al., "Sequential Lateral Solidification of Silicon Thin Films on Cu BEOL-Integrated Wafers for Monolithic 3-D Integration," IEEE Transactions on Electron Devices, vol. 62, No. 11, Nov. 2015, pp. 3887-3891.
M. Johnson et al., "512-Mb PROM with a Three-Dimensional Array of Diode/Antifuse Memory Cells," IEEE Journal of Solid-State Circuits, Nov. 2003, pp. 1920-1928, vol. 38, No. 11.
M. Crowley et al., "512Mb PROM with 8 Layers of Antifuse/Diode Cells," IEEE International Solid-State Circuits Conference (ISSCC), Paper 16.4, Feb. 13, 2003, 10 pages.
U.S. Appl. No. 16/292,894 filed in the name of Alexander Reznicek et al. filed Mar. 5, 2019 and entitled "Resistive Memory with Amorphous Silicon Filaments."
U.S. Appl. No. 15/845,830 filed in the name of Alexander Reznicek et al. filed Dec. 18, 2017 and entitled "Resistive Memory with Amorphous Silicon Filaments."
List of IBM Patents or Patent Applications Treated as Related.

* cited by examiner

A-A

A-A

B-B

A-A

B-B

A-A

B-B

A-A

THREE-DIMENSIONAL STACKABLE MULTI-LAYER CROSS-POINT MEMORY WITH BIPOLAR JUNCTION TRANSISTOR SELECTORS

BACKGROUND

Memory cells may include, for example, phase-change random-access memory (PCRAM), resistive random-access memory (RRAM or ReRAM), magnetic random-access memory (MRAM), and/or fuse/anti-fuse devices. Memory devices, such as, for example, RRAM devices, can be stacked in a three-dimensional (3D) configuration. Commercially available 3D memory devices include Crossbar™ ReRAM, from Crossbar, Inc. of Santa Clara, Calif., and 3D XPoint™, from Intel Corporation of Santa Clara, Calif. Storage in the 3D memory devices may be based on resistance changes in a stackable cross-gridded data access array.

A "cross-point" structure includes a configuration of memory cells at the intersection of wordlines and bitlines, allowing the cells to be addressed individually. As a result, data can be written and read in small sizes, leading to fast and efficient read/write processes. The cross-point structures demonstrated to date employ 2-terminal devices as the memory selection elements (e.g., ovonic threshold switch (OTS) 3D XPoint™ devices). Three-terminal selection devices (transistors) have various advantages including, but not necessarily limited to: (i) relatively large ON currents, while maintaining a relatively large ON/OFF ratio; (ii) operation in a bidirectional mode (although with some asymmetry due to placement of memory); (iii) relatively easy tunability of turn-on voltage by adjusting doping; and (iv) Using gates (or bases) to constrain saturation current can enforce local current compliance, which may be important for some non-volatile memory (NVM) applications.

However, three-terminal selection devices have some issues including, for example, (i) relatively large size; (ii) relatively complicated processing; and (iii) incompatibility with 3D multilayer back-end-of-line (BEOL) stacking due to the required high thermal processing budget.

SUMMARY

According to an exemplary embodiment of the present invention, a method for manufacturing a semiconductor memory device includes forming a first doped semiconductor layer on a conductive layer, forming a second doped semiconductor layer stacked on the first doped semiconductor layer, forming a third doped semiconductor layer stacked on the second doped semiconductor layer, and forming a memory stack layer on the third doped semiconductor layer. In the method, a plurality of extrinsic base layers are formed adjacent the patterned second doped semiconductor layers. The memory stack layer and the first, second and third doped semiconductor layers are patterned into a plurality of pillars spaced apart from each other. The patterned first, second and third doped semiconductor layers in each pillar of the plurality of pillars are components of a bipolar junction transistor device, and the plurality of pillars are parts of a memory cell array having a cross-point structure.

According to an exemplary embodiment of the present invention, a semiconductor device includes a plurality of stacked structures spaced apart from each other and formed on a plurality of select lines. Each of the plurality of stacked structures comprises a first doped semiconductor layer on a select line of the plurality of select lines, a second doped semiconductor layer stacked on the first doped semiconductor layer, a third doped semiconductor layer stacked on the second doped semiconductor layer, and a memory element stacked on the third doped semiconductor layer. A plurality of extrinsic base layers extend from the second doped semiconductor layers. The first, second and third doped semiconductor layers in each stacked structure of the plurality of stacked structures are components of a bipolar junction transistor device, and the plurality of stacked structures are parts of a memory cell array having a cross-point structure.

According to an exemplary embodiment of the present invention, a method for manufacturing a semiconductor device includes forming a plurality of doped polycrystalline semiconductor layers in a stacked configuration on a conductive layer, and forming a memory stack layer on an uppermost doped semiconductor layer of the plurality of doped polycrystalline semiconductor layers. The memory stack layer and the plurality of doped polycrystalline semiconductor layers are patterned into a plurality of pillars spaced apart from each other. The patterned plurality of doped polycrystalline semiconductor layers in each pillar of the plurality of pillars comprise respective emitter, base and collector layers of a selector device. A plurality of extrinsic base layers are formed adjacent the base layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
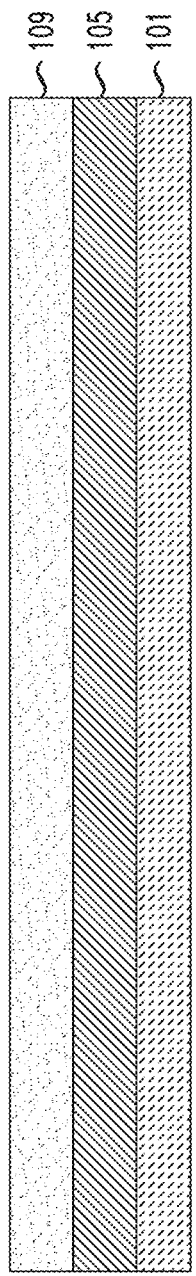
FIG. 1 is a schematic cross-sectional view illustrating manufacturing of a memory device and showing a select line and a highly doped amorphous silicon (a-Si) layer formed on a dielectric layer, according to an embodiment of the invention.

Exemplary embodiments of the invention will now be discussed in further detail with regard to semiconductor devices and methods of manufacturing same and, in particular, to forming 3D cross-point memory arrays comprised of bipolar junction transistor (BJT) selector devices.

It is to be understood that the various layers and/or regions shown in the accompanying drawings are not drawn to scale, and that one or more layers and/or regions of a type commonly used in, for example, random-access memory (RAM), phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, RAM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to RAM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use RAM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Memory devices, (e.g., RAM, RRAM devices) according to one or more embodiments, are stacked in a 3D cross-point configuration. As noted above, a "cross-point" structure includes a configuration of memory cells at the intersection of wordlines and bitlines. In the structure, each of the memory cells can be addressed individually, so that data can be written and read in small sizes. As used herein, a "3D cross-point" structure includes two or more stacked layers of cross-point/crossbar memory structures. Storage in RRAM devices is based on resistance changes in a stackable cross-gridded data access array.

One or more embodiments relate to methods and structures that enable 3D multilayer BEOL stacking of cross-point memory structures with BJTs as selection devices. The embodiments are applicable to phase-change memory (PCM) and MRAM, but are also applicable to other memory elements, such as, but not necessarily limited to, RRAM. The embodiments include 3D multilayer BEOL stacking enabled by a combination of pulsed laser annealing and low-temperature epitaxial growth. In some embodiments, the base of the bipolar transistor is comprised of germanium or SiGe, while the emitter is comprised of silicon, which has a larger bandgap than SiGe, thus enabling relatively larger transistor gain compared to a bipolar transistor where the base and emitter are both comprised of silicon. In these embodiments, an extrinsic base and/or collector may also be comprised of silicon. A select-line is patterned into a plurality of select lines arranged in rows or columns, thus enabling further flexibility in addressing/programming (e.g., multi-level or parallel schemes) as well as hard or soft error correction, when compared with a common select line. Alternatively, a common (i.e. non-patterned) select line similar to common-emitter or common-collector lines may also be used.

As known in the art, the designation of collector and emitter terminals in bipolar transistors (e.g., BJTs) depends on the polarities of the operation voltages applied to the transistors. As such, in the exemplary embodiments described below, the designation of collector and emitter regions are interchangeable, and the transistor terminal connected to the memory element may function either as the emitter or as the collector of the transistor depending on the voltage polarity used during a certain operation.

FIG. 1 is a schematic cross-sectional view illustrating manufacturing of a memory device and showing a select line 105 and a highly doped amorphous silicon (a-Si) layer 109 formed on a dielectric layer 101, such as an inter-layer dielectric (ILD layer, according to an embodiment of the invention.

The material of the dielectric layer 101 can include, but is not necessarily limited to, a low-K dielectric material, such as, for example, silicon oxide, silicon nitride, silicon oxynitride, boron nitride, and/or silicon boron nitride. The dielectric layer 101 is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, which may be followed by a planarization process, such as, chemical mechanical polishing (CMP), to remove excess portions of the layer 101 after deposition.

Figure 8:
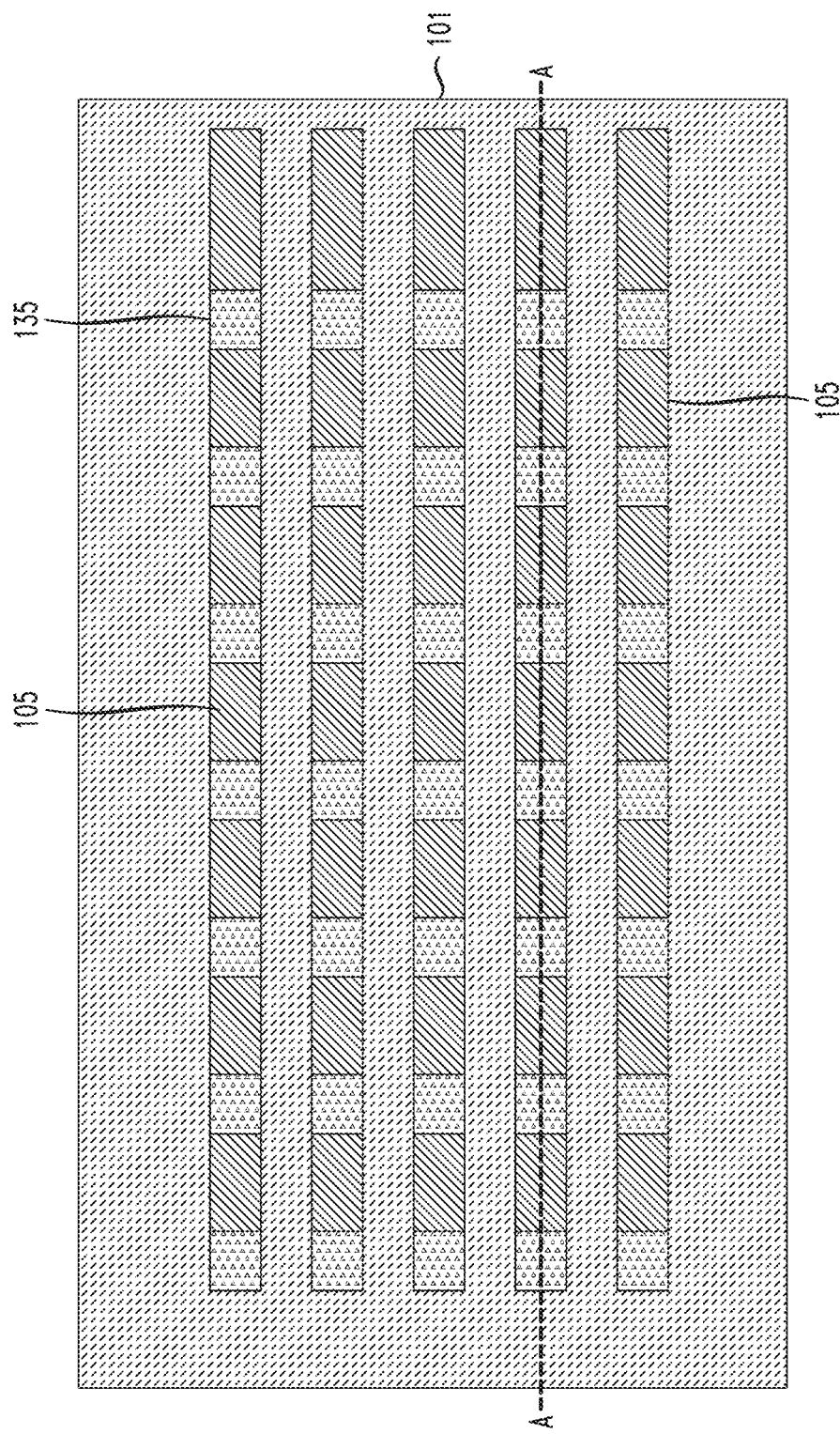
FIG. 8 is a schematic top view illustrating manufacturing of a memory device and showing patterning of memory stack, collector, base and emitter layers, according to an embodiment of the invention.

The material of the select line 105 can include an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The select line 105 can be deposited using, for example, CVD, PECVD, RFCVD, PVD, ALD, MLD, MBD, PLD, LSMCD, and/or sputtering, followed by planarization by, for example, CMP. The select line 105 can be patterned to form a plurality of select lines spaced apart from each other, using, for example, photolithography and reactive ion etching (ME) which may optionally include a dielectric hardmask such as oxide or nitride. In accordance with one or more embodiments, a plurality of select lines 105 are formed to be spaced apart from each other on a dielectric layer 101 (e.g., an ILD layer). The top view in FIG. 8 illustrates a plurality of select lines 105 spaced apart from each other on the dielectric layer 101. Alternatively, as described further in connection with FIG. 8, the select line 105 is not patterned, thus forming a common select electrode for all cells.

A highly doped a-Si layer 109 is formed on each of the select lines 105. In accordance with an embodiment of the present invention, the a-Si layer 109 is $n^+$ doped, and is doped with, for example, arsenic (As) or phosphorus (P) at a total concentration in the general range of $10^{20}/cm^3$-$10^{21}/cm^3$. As explained herein below, a stacked $n^+p$-$n^+$ structure is formed. Alternatively, a $p^+$-$n$-$p^+$ structure is formed, where the a-Si layer 109 is $p^+$ doped, and is doped with, for example, boron (B) at a total (i.e. active and/or inactive) concentration in the general range of $10^{20}/cm^3$-$10^{21}/cm^3$. Layers which are n+ or p+ doped are referred to as highly doped, and layers which are n or p doped are referred to as moderately doped.

A thickness (e.g., height with respect to the underlying layer) of the highly doped a-Si layer 109 can be approximately 5 nm-approximately 25 nm, but thinner or thicker layers may be used as well. The a-Si layer can be deposited using, for example CVD, PECVD, RFCVD, hot-wire CVD (HWCVD), PVD, ALD, MLD, MBD, PLD, LSMCD, and/or sputtering. The percentage of the active doping concentration in a-Si may be, for example, in the range of 1-10%. The a-Si layer may be doped in-situ during deposition (e.g. with dopant gases introduced in the gas mixture in CVD-based techniques, or using a doped solid target in PVD-based techniques) or introduced after deposition, e.g. using ion-implantation. The a-Si films may contain elements such as, e.g. hydrogen (H), helium (He), argon (Ar), nitrogen (N), germanium (Ge) and carbon (C) which may be incorporated into the film, e.g. from precursor gases and/or carrier gases during growth.

Figure 2:
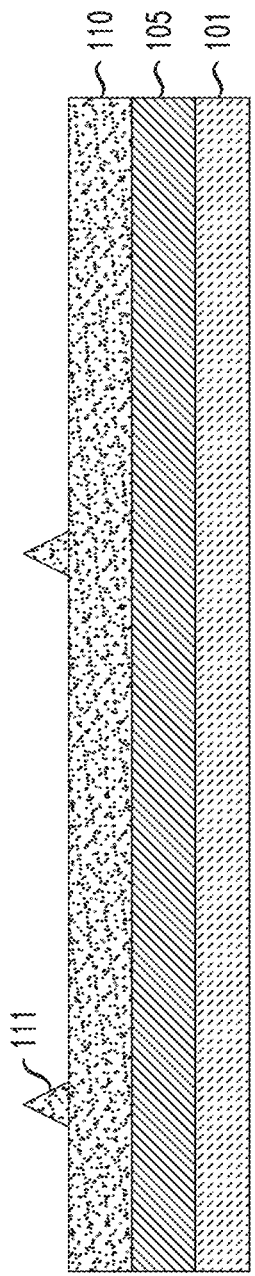
FIG. 2 is a schematic cross-sectional view illustrating manufacturing of a memory device and showing transformation of the highly doped a-Si to a polysilicon emitter layer, according to an embodiment of the invention.

FIG. 2 is a schematic cross-sectional view illustrating manufacturing of a memory device and showing transformation of the highly doped a-Si to polysilicon, according to an embodiment of the invention. Referring to FIG. 2, the a-Si layer 109 is crystallized into a polysilicon emitter layer 110 using, for example, laser crystallization, such as ELA, which can be performed at a temperature of less than ~400° C. Laser pulses with short durations generate local heat which may be efficiently dissipated, allowing for maintaining the substrate at temperatures as low as room temperature (or lower than room temperature if substrate cooling is used). The polysilicon emitter layer 110 has the same doping type and about the same doping concentration as the a-Si layer 109. A small portion of dopant species may escape from the surface in gaseous form during crystallization; however, the percentage of active doping may substantially improve after crystallization, e.g., from 1-10% to over 95%. Once patterned, the respective patterned portions of the polysilicon emitter layer 110 function as emitters of respective BJT selector devices of each memory cell.

During the laser annealing process, surface protrusions 111 (also referred to as surface spikes) may be formed on the surface of the resulting polysilicon layer 110. Some preparation methods and/or conditions (e.g., one-shot ELA), may result in surface protrusions at grain-boundary locations.

In one example, the excimer laser energy density (fluence) is in the range of 350 mJ/cm$^2$-450 mJ/cm$^2$, the laser pulse width is in the range of 10 ns-50 ns and the repetition rate is in the range of 100 Hz-1 KHz. The number of laser pulses (shots) may be in range of 1-100, but a larger number of pulses may also be used. Other laser crystallization techniques known in the art, such as sequential lateral solidification (SLC) may also be used. In embodiments where a-Si contains volatile elements, such as H, Ar and He, a low-temperature thermal treatment (e.g. furnace anneal at 400° C.) or low-energy laser treatment (e.g. with fluence below 300 mJ/cm$^2$) may be performed before laser crystallization to substantially reduce the concentration of the volatile elements (e.g., to lower than 1%) in order to avoid explosive release of these elements (and therefore formation of voids) during laser crystallization.

Figure 3:
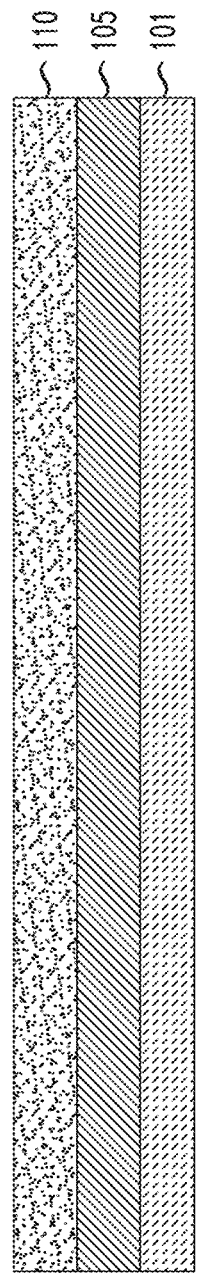
FIG. 3 is a schematic cross-sectional view illustrating manufacturing of a memory device and showing removal of surface spikes formed as a result of the transformation of the highly doped a-Si to polysilicon, according to an embodiment of the invention.

FIG. 3 is a schematic cross-sectional view illustrating manufacturing of a memory device and showing removal of surface spikes formed as a result of the transformation of the highly doped a-Si to polysilicon, according to an embodiment of the invention. Referring to FIG. 3, the surface protrusions 111 may be removed, using chemical and/or mechanical methods, such as, for example, CMP.

Figure 4:
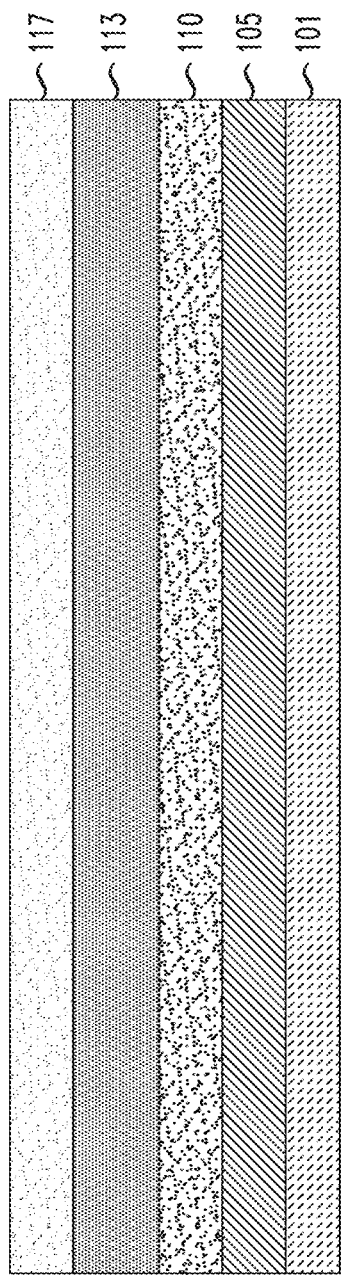
FIG. 4 is schematic cross-sectional view illustrating manufacturing of a memory device and showing formation of layers of moderately doped silicon germanium (SiGe) and highly doped silicon, according to an embodiment of the invention.

FIG. 4 is schematic cross-sectional view illustrating manufacturing of a memory device and showing formation of layers of moderately doped SiGe and highly doped silicon, according to an embodiment of the invention. Referring to FIG. 4, moderately doped SiGe and highly doped silicon layers 113 and 117 are formed on the highly doped polysilicon layer 110. In accordance with an embodiment of the present invention, p-doped polycrystalline SiGe and n+ doped polycrystalline silicon layers 113 and 117 are grown epitaxially (i.e., following the crystalline structure of the polysilicon layer 110) using low-temperature techniques such as PECVD and HWCVD; or amorphous SiGe (a-SiGe), nano-crystalline SiGe (nc-SiGe) or micro-crystalline SiGe (µc-SiGe) layers 113, and a-Si, nano-crystalline silicon (nc-Si) or micro-crystalline silicon (µc-Si) layers 117 are deposited non-epitaxially using techniques, such as, for example, CVD, PECVD, HWCVD, RFCVD, PVD, ALD, MLD, MBD, PLD, LSMCD, and/or sputtering, and converted into poly SiGe and polysilicon after deposition, e.g. by laser crystallization (see, e.g., FIG. 5). The conversion into poly SiGe and polysilicon may be epitaxial (i.e., layers 113 and 117 follow the crystalline structure of the polysilicon layer 110 during crystallization) or may be non-epitaxial (i.e., layers 113 and 117 do not follow the crystalline structure of the polysilicon layer 110 during crystallization). The growth and crystallization of a lightly-doped layer is performed using the same techniques described with respect to a moderately doped layer 113.

Low-temperature epitaxial growth of the highly doped and moderately doped layers 117, 113 may be performed using plasma-enhanced chemical vapor deposition (PECVD) at temperatures below ~400° C., such as, 150°

C.-350° C., in some embodiments. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In a low-temperature epitaxial deposition process, the system parameters are set such that the carrier (e.g. hydrogen) radicals present in the gas mixture selectively remove the weak atomic bonds formed on the growth surface (which would otherwise result in non-crystalline growth) thus resulting in a semiconductor material that has substantially the same crystalline characteristics as the deposition surface on which the epitaxially grown material is formed. In one example, a mixture of $SiH_4$ (silane) and $H_2$ (hydrogen) gases with a gas flow ratio of $[H_2]/[SiH_4]>5$ is used for PECVD epitaxy and the resulting epitaxial polysilicon layer contains between 5-40% hydrogen. The system parameters may be set (e.g. $[H_2]/[SiH_4]<5$) such that the growth is non-epitaxial, i.e., resulting in hydrogenated a-Si, nc-Si or μc-Si. In another example, a mixture of $SiH_4$ (silane), $GeH_4$ (germane) and $H_2$ (hydrogen) gases with a gas flow ratio of $[H_2]/([SiH_4]+[GeH_4])>5$ is used for PECVD epitaxy and the resulting epitaxial polysilicon layer contains between 5-40% hydrogen. The system parameters may be set (e.g. $[H_2]/([SiH_4]+[GeH_4])<5$) such that the growth is non-epitaxial, i.e., resulting in hydrogenated a-SiGe, nc-SiGe or μc-SiGe.

The epitaxial deposition process may employ the deposition chamber of a plasma-enhanced chemical vapor deposition (PECVD) apparatus where plasma may be generated from a DC source, an RF source or very-high-frequency (VHF) source; or a hot-wire chemical vapor deposition (HWCVD) apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. By "in-situ", it is meant that the dopant that dictates the conductivity type of the doped layer is introduced during the process step, e.g., epitaxial deposition, that forms the doped layer. Dopant gases used for n-type doping may include, e.g., phosphine ($PH_3$) and arsine ($AsH_3$), and the dopant gases used for p-type doping may include, e.g., diborane ($B_2H_6$) or Trimethylborane ($B(CH_3)_3$, also known as TMB).

In accordance with an embodiment of the present invention, the layer 113 is p-doped, and is doped with, for example, boron (B) at a concentration in the general range of $5\times10^{18}/cm^3$-$5\times10^{19}/cm^3$, and the layer 117 is n+ doped, and is doped with, for example, arsenic (As) or phosphorous (P) at a concentration in the general range of $10^{20}/cm^3$-$10^{21}/cm^3$. As explained herein, a stacked $n^+p$-$n^+$ structure is formed. Alternatively, a $p^+$-n-$p^+$ structure is formed, where the layer 113 is n-doped, and the layer 117 is $p^+$ doped. A thickness (e.g., height with respect to the underlying layer) of the layers 113 and 117 can be approximately 3 nm-approximately 15 nm, but thicker or thinner layers may be used as well.

Figure 5:
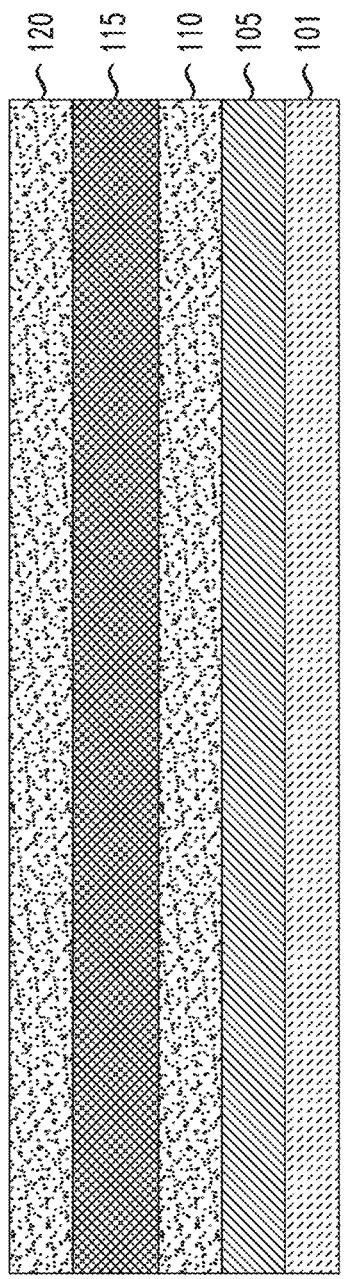
FIG. 5 is schematic cross-sectional view illustrating manufacturing of a memory device and showing transformation of the layers of moderately doped SiGe and highly doped Si to a poly-SiGe base layer and a polysilicon collector layer, according to an embodiment of the invention.

FIG. 5 is schematic cross-sectional view illustrating manufacturing of a memory device and showing transformation of the layers of moderately doped SiGe and highly doped Si to poly-SiGe and polysilicon, according to an embodiment of the invention. Referring to FIG. 5, a-SiGe, nano-crystalline silicon (nc-SiGe), or micro-crystalline silicon (μc-SiGe) layers 113, and a-Si, nano-crystalline silicon (nc-Si), or micro-crystalline silicon (μc-Si) layers 117 are crystallized to result in a moderately doped poly SiGe base layer 115 and a highly doped polysilicon collector layer 120. Similar to what is described in connection with FIG. 2, laser crystallization, such as ELA, can be performed at a temperature of less than ~400° C. to transform the layers 113, 117 into poly-SiGe and polysilicon layers 115, 120. The poly-SiGe and polysilicon layers 115, 120 have the same doping as the layers 113, 117, but the doping activation may improve during crystallization. Although not shown, like the surface protrusions 111 discussed in connection with FIG. 2, surface protrusions may be formed on the surface of the resulting polysilicon layer 120 as a result of a laser annealing process, which can be removed using chemical and/or mechanical methods, such as, for example, CMP.

In embodiments where base and collector layers 113 and 117 are grown epitaxially and therefore are polycrystalline after growth, a laser treatment step may be optionally performed to improve the crystallinity (e.g. reduce the crystal defects) and/or increase doping activation in layers 113 and 117. Other treatments generally known to improve crystallinity, increase doping activation and/or passivate dangling bonds, such as, e.g., rapid thermal annealing (RTA), forming gas anneal (FGA) and flash lamp anneal, may also be optionally used in conjunction with laser crystallization or laser treatment, as long as the treatment temperature is maintained below ~400° C.

According to an embodiment, either or both the emitter and collector layers 110 and 120 have a bandgap wider than that of the base layer 115. According to an embodiment, the emitter, base and collector layers 110, 115 and 120 comprise n+ doped silicon, p doped SiGe and n+ doped silicon, respectively. According to an embodiment, stacked n+-p-n+ structures of emitters, bases and collectors are formed when the emitter, base and collector layers 110, 115 and 120 are patterned. Alternatively, if the doping scheme is changed, stacked p+-n-p+ structures of emitters, bases and collectors are formed. In another embodiment, as an alternative to SiGe, the base layer 115 may comprise silicon, in which case, the emitter, base and collector layers 110, 115 and 120 each comprise, for example, polysilicon.

Figure 6:
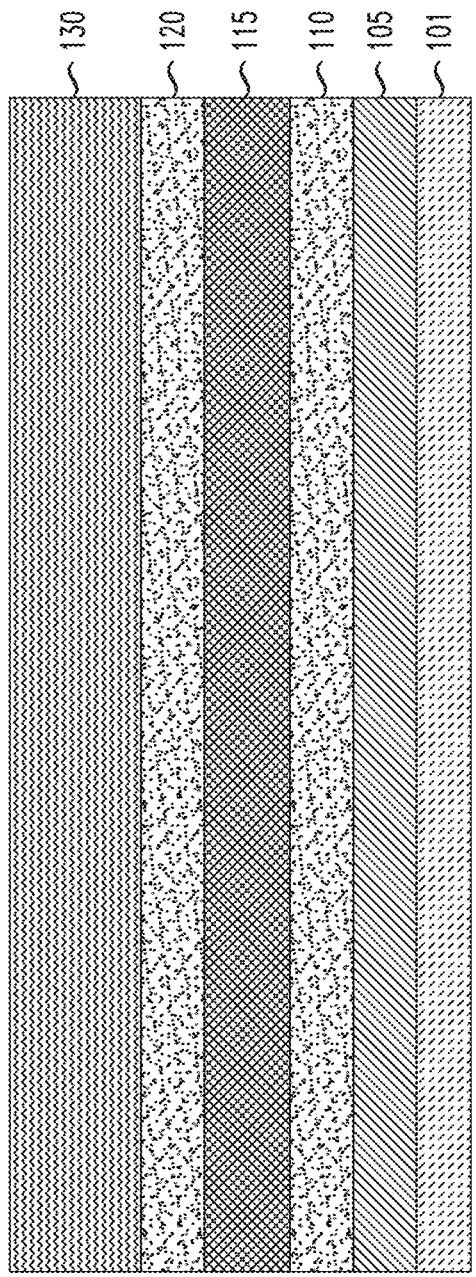
FIG. 6 is a schematic cross-sectional view illustrating manufacturing of a memory device and showing formation of a memory stack on the polysilicon collector layer, according to an embodiment of the invention.

Referring to FIG. 6, a memory stack 130 is formed on the collector layer 120. According to one or more embodiments, the memory stack can comprise memory devices, such as, but not necessarily limited to, PCRAM, MRAM, RRAM (or ReRAM), and/or magnetic tunnel junction (MTJ) devices.

Figure 7:
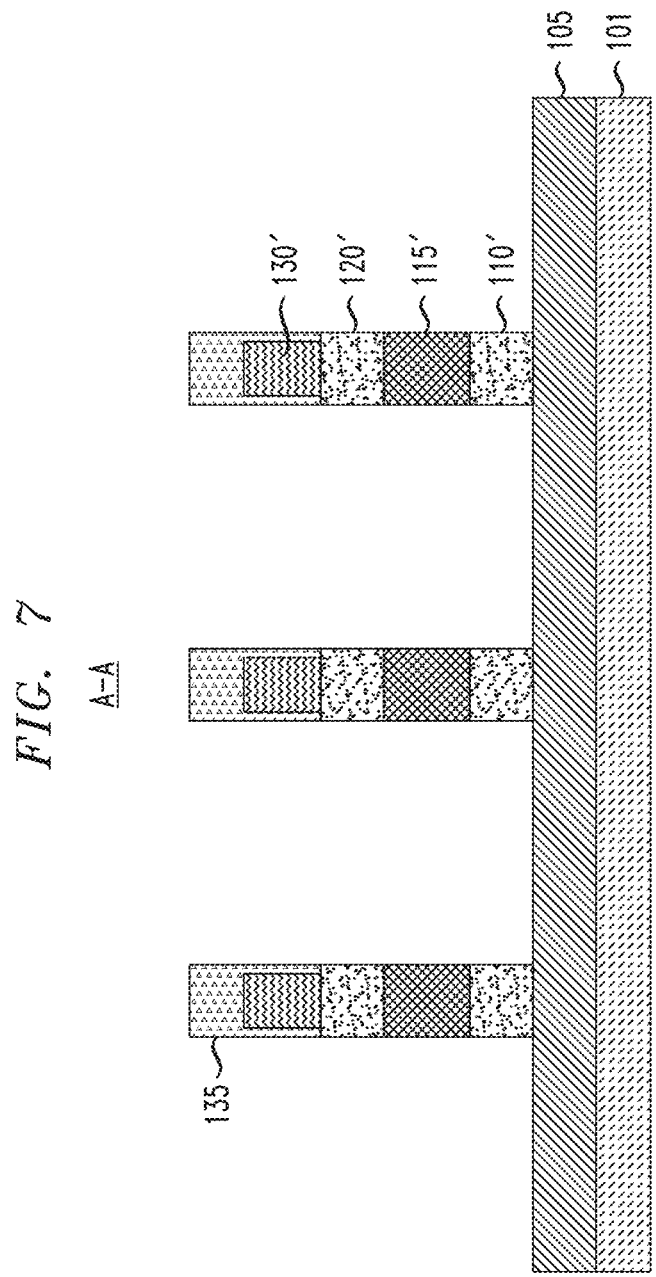
FIG. 7 is a schematic cross-sectional view taken along the line A-A in FIG. 8 illustrating manufacturing of a memory device and showing patterning of memory stack, collector, base and emitter layers, according to an embodiment of the invention.

FIG. 7 is a schematic cross-sectional view taken along the line A-A in the top view of FIG. 8. Referring to FIGS. 7 and 8, memory stack, collector, base and emitter layers 130, 120, 115 and 110 are patterned into stacked structures (referred to herein as "pillars"), which are spaced apart from each other. The patterned portions of the memory stack, collector, base and emitter layers in each pillar are a memory element 130', a collector 120', a base 115' and an emitter 110', respectively. According to an embodiment, the pillars are on a corresponding select line 105 of a plurality of select lines. Alternatively, the pillars are on a common select line (not shown).

According to a non-limiting embodiment, the memory stack layer 130 is patterned to form memory elements 130'. The memory stack layer 130 is patterned into the memory elements by, for example, an etching process, wherein portions of the memory stack layer 130 are masked, and exposed portions are removed by etching. The remaining memory elements have a lateral width that is less than that of the underlying layers 110', 115' and 120' forming the BJTs. Following patterning to form the memory elements 130', the masks used for patterning the memory stack layer 130 are removed, and cap layers 135 are deposited to encapsulate the memory elements 130', covering the memory elements 130' on top and side surfaces. The cap layers 135 are planarized with a planarization process, such as, for example, CMP. The cap layers 135 include, for example, SiN, SiON, BN or SiBN. Using the cap layers 135 as masks, the exposed portions of the layers 110, 115 and 120 are removed using, for example, a reactive ion etching (ME) process including, such as $SF_6/O_2$ plasma, $SF_6/CHF_3$ plasma, $SF_6/CCl_2F_2$ or $CF_4$ plasma to form the BJT portions of the pillars comprising the emitter, base and collector layers 110', 115' and 120'. The etching is performed down to a select line 105 of a plurality of select lines, or a common select line.

As noted above, stacked n+-p-n+ structures of emitters, bases and collectors 110', 115' and 120', respectively, are formed. Alternatively, stacked p+-n-p+ structures of emitters, bases and collectors 110', 115' and 120', respectively, are formed. Although FIG. 7 shows three pillars for ease of explanation, as can be seen in FIG. 8, a plurality of pillars are formed on each select line 105 of a plurality of select lines formed on the dielectric layer 101.

Figure 9:
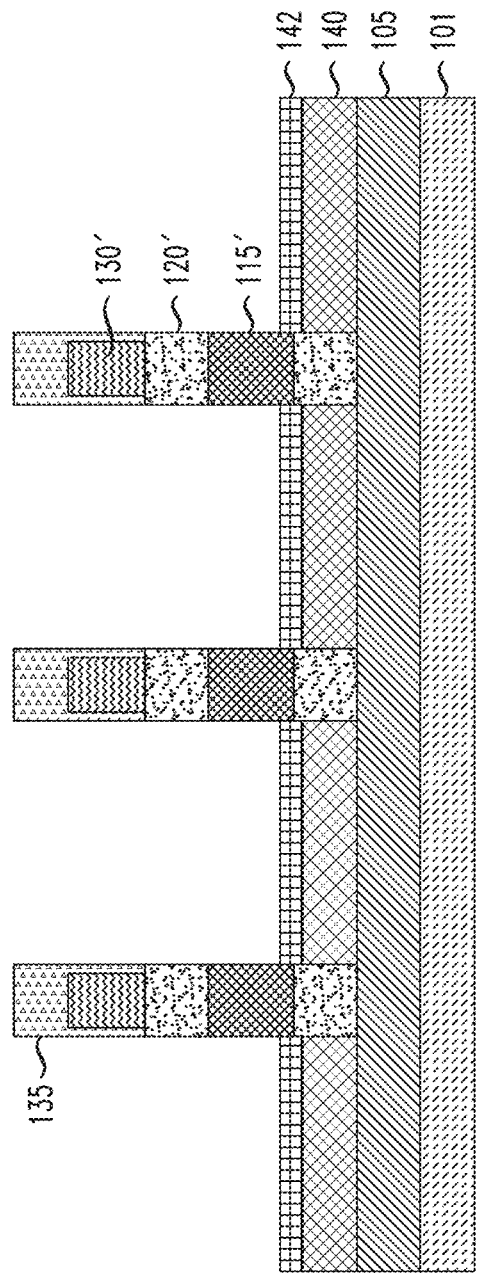
FIG. 9 is a schematic cross-sectional view taken along the line A-A in FIG. 10 illustrating manufacturing of a memory device and showing formation of dielectric and spacer layers, according to an embodiment of the invention.
Figure 10:
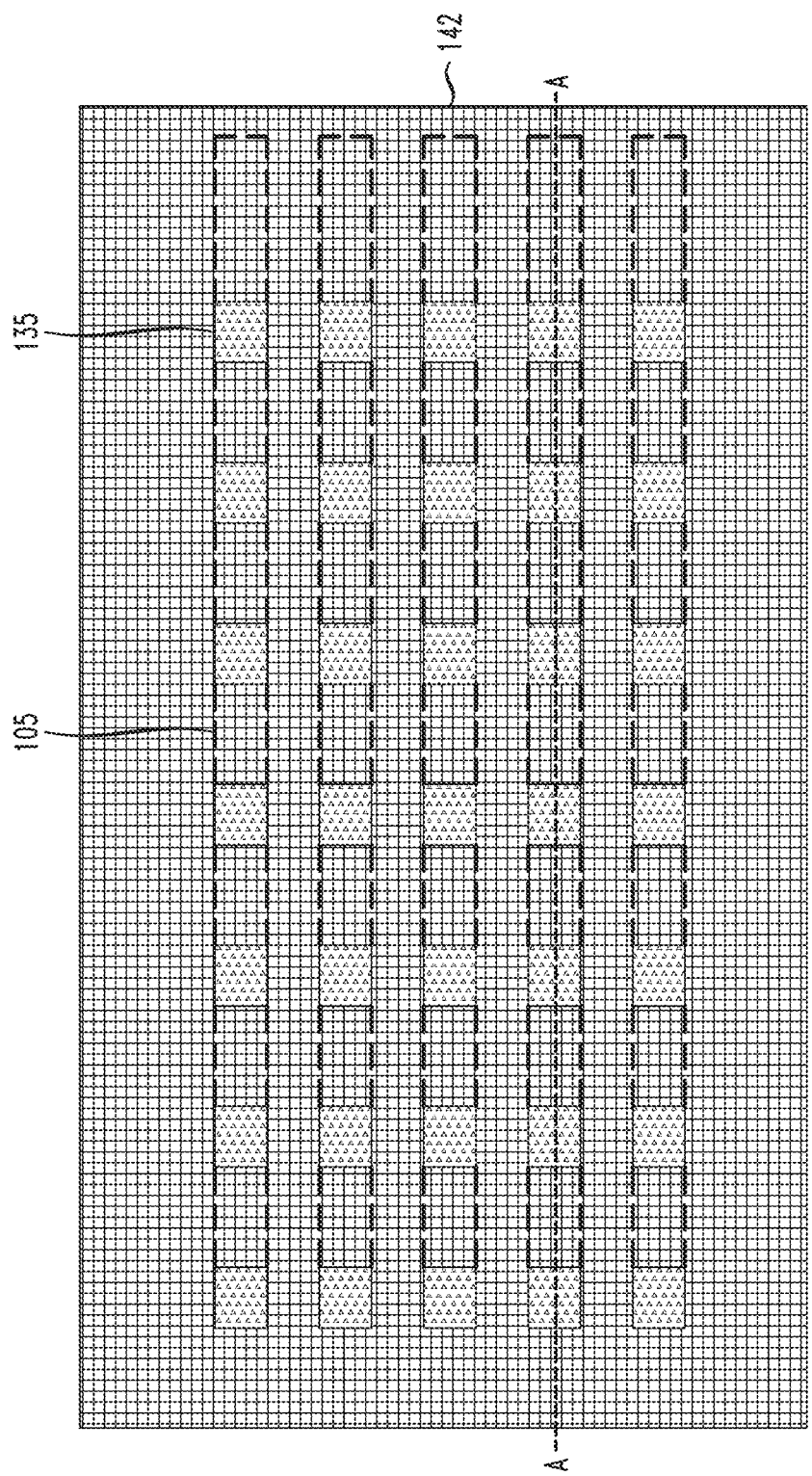
FIG. 10 is a schematic top view illustrating manufacturing of a memory device and showing formation of dielectric and spacer layers, according to an embodiment of the invention.

FIG. 9 is a schematic cross-sectional view taken along the line A-A in the top view of FIG. 10. Referring to FIGS. 9 and 10, dielectric and spacer layers are formed on and between the plurality of select lines 105 adjacent bottom portions of the pillars. More specifically, a dielectric layer 140, such as, for example, an oxide, is formed on and between the plurality of select lines 105 and in the spaces between the patterned pillars including the layers 110', 115', 120' and 130'. The material of the dielectric layer 140 can include, but is not necessarily limited to, a low-K dielectric material, such as, for example, silicon oxide. The dielectric layer 140 can be deposited using deposition techniques such as, for example, CVD, PECVD, RFCVD, PVD, ALD, MBD, PLD, and/or LSMCD, and/or sputtering, which may be followed by etching, such as RIE, to recess the deposited dielectric layer 140 to a desired height. Alternatively, a flowable oxide can be deposited to the desired height of the dielectric layer 140 using, for example, CVD. A thickness (e.g., height with respect to the underlying select line 105) of the layer 140 can be approximately 5 nm-approximately 20 nm, but thicker or thinner layers may be used as well.

Following deposition of the dielectric layer 140, a spacer layer 142 comprising, for example, a nitride, such as, but not necessarily limited to, silicon oxycarbonitride (SiOCN) or silicon boron carbonitride (SiBCN) is deposited on the dielectric layer 140. The spacer layer 142 can be deposited using deposition techniques such as, for example, CVD, PECVD, RFCVD, PVD, ALD, MBD, PLD, and/or LSMCD, and/or sputtering, and a thickness (e.g., height with respect to the underlying layer) of the layer 142 can be approximately 5 nm-approximately 15 nm, but thicker or thinner layers may be used as well. According to an embodiment, the spacer layer 142 overlaps junctions between the emitter and base layers 110' and 115' (e.g., n+-p junction).

Figure 11:
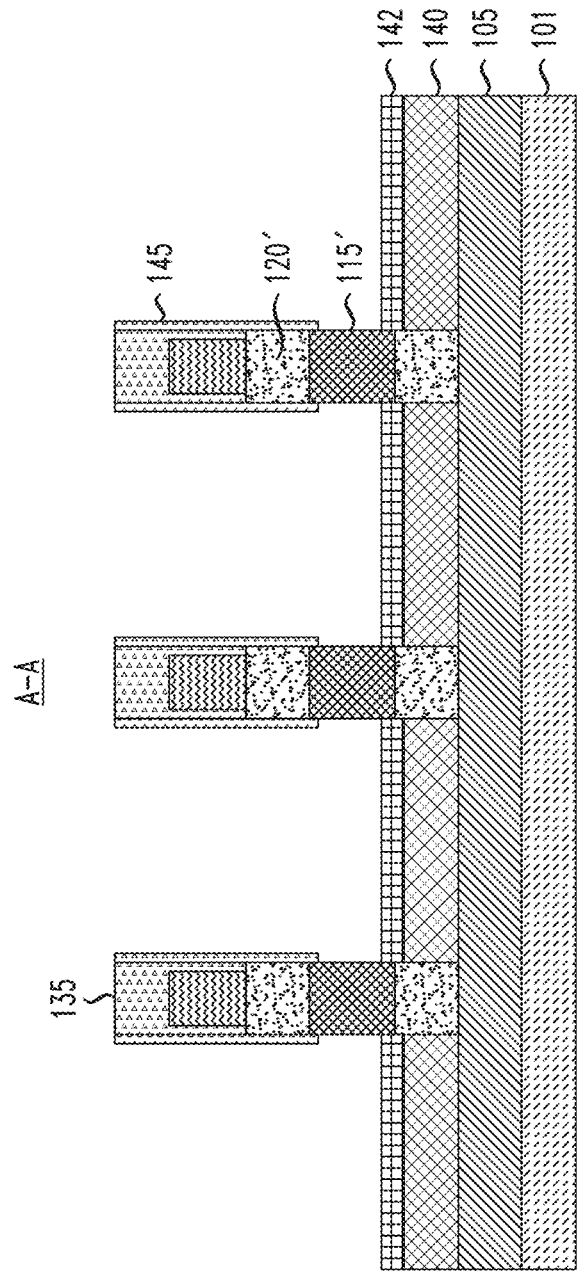
FIG. 11 is a schematic cross-sectional view taken along the line A-A in FIG. 12 illustrating manufacturing of a memory device and showing formation of hanging spacers, according to an embodiment of the invention.
Figure 12:
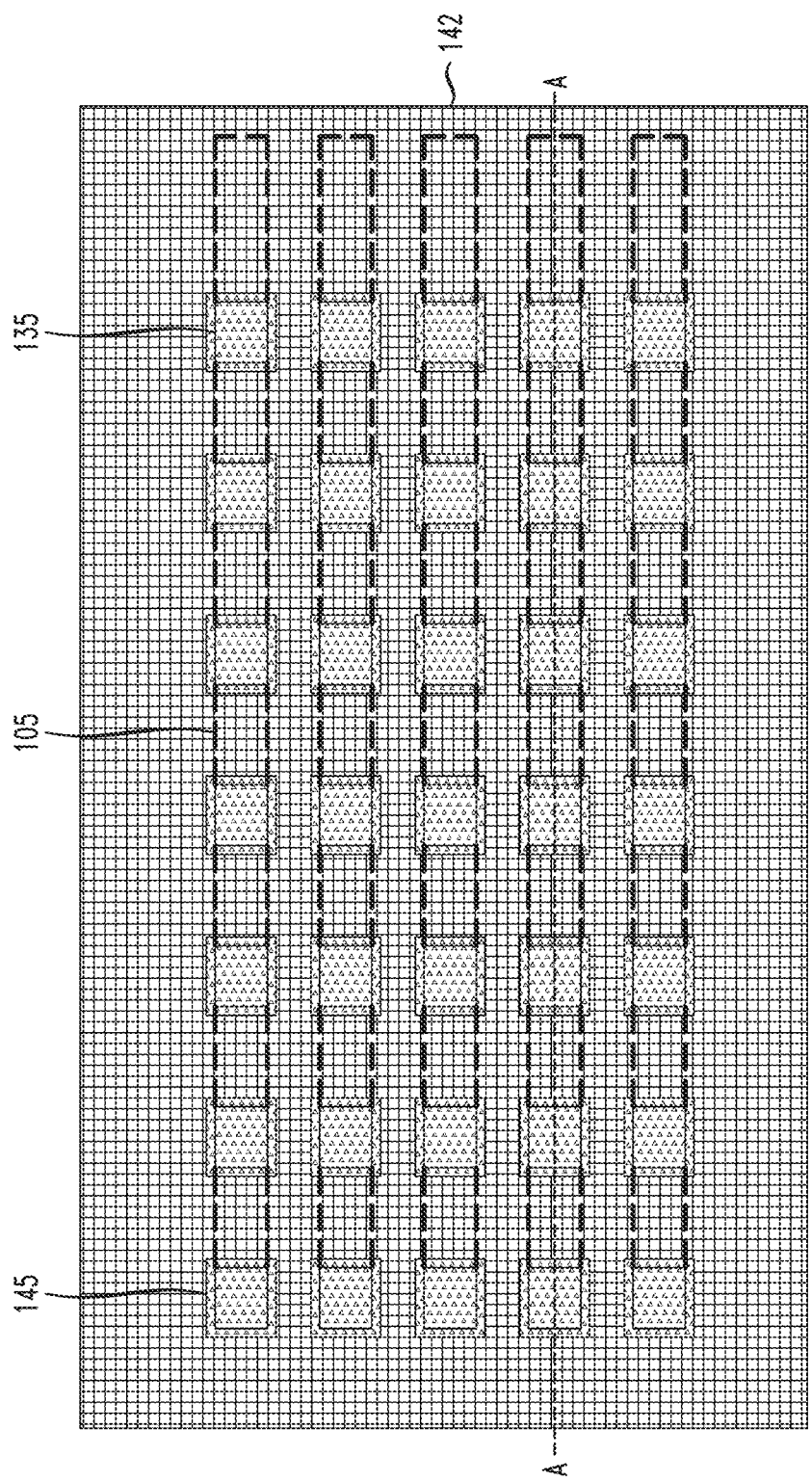
FIG. 12 is a schematic top view illustrating manufacturing of a memory device and showing formation of hanging spacers, according to an embodiment of the invention.

FIG. 11 is a schematic cross-sectional view taken along either line A-A in the top view of FIG. 12. Referring to FIGS. 11 and 12, hanging spacers 145 are formed on sides of the patterned pillars including the cap layers 135 thereon. The spacers 145 are referred to herein as "hanging" because they do not extend all the way down to the spacer layer 142, and appear to be suspended from top surfaces of the cap layers 135. The hanging spacers 145 are formed on and cover the sides of the cap layers 135 and the collector layers 120'. The hanging spacers 145 also extend down to and are formed on part (e.g., upper part) of the sides of the base layer 115'. The hanging spacers 145 can be formed using a variety of techniques. According to an embodiment, the hanging spacers 145 are formed by depositing a sacrificial insulating layer (not shown) on the spacer layer 142, recessing the sacrificial insulating layer to a height where the hanging spacers are to end (e.g., at an upper portion of the base layer 120' as in FIG. 11), depositing the material of the hanging spacers 145 by conformal deposition (e.g., ALD or CVD), performing an isotropic etch to remove horizontal portions of the deposited spacer material to form the hanging spacers 145, and selectively removing (e.g., etching or stripping) the sacrificial insulating layer. The material of the hanging spacers 145 includes, but is not necessarily limited to, silicon oxide, SiN, SiON, BN, and/or SiBN. As can be understood from FIGS. 11 and 12, the hanging spacers 145 surround the cap layers 135, the collector layers 120' and the portions of the base layers 115' on all lateral sides. A thickness of the hanging spacers 145 with respect to the layers 135, 120' and 115' on which they are formed is about 5 nm-about 10 nm. According to an embodiment, the hanging spacers 145 may comprise the same or similar material as the cap layers 135.

Figure 13:
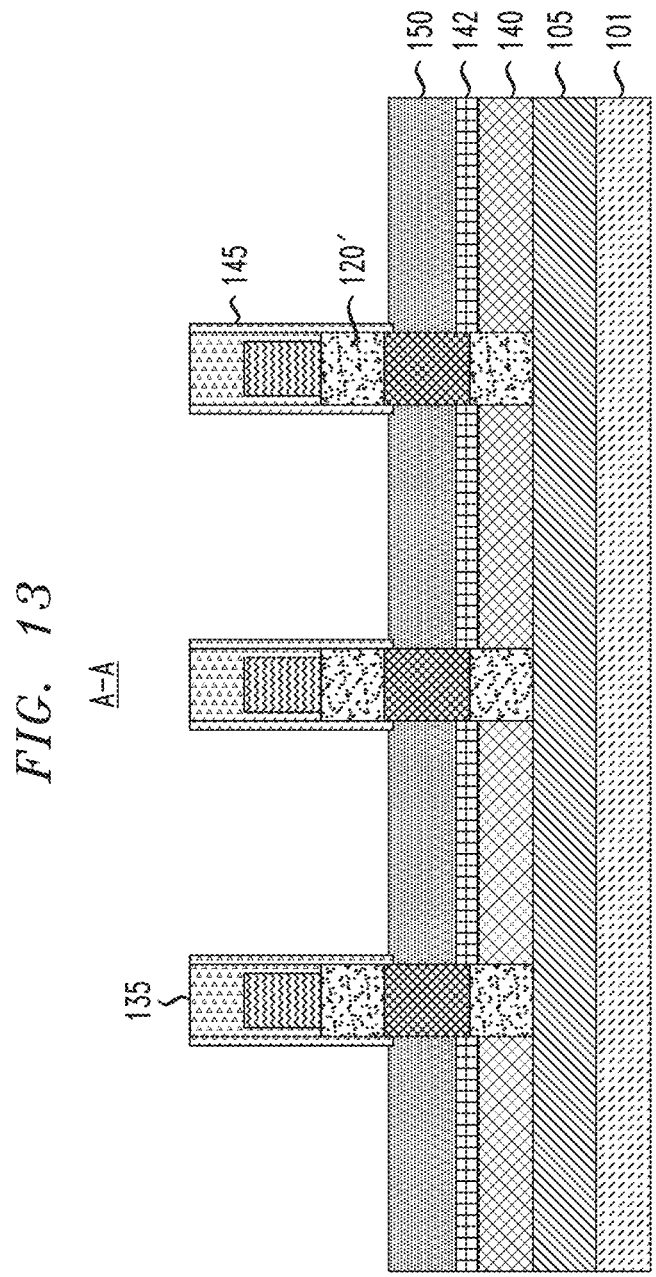
FIG. 13 is a schematic cross-sectional view taken along the line A-A in FIG. 14 illustrating manufacturing of a memory device and showing formation of an extrinsic base layer, according to an embodiment of the invention.
Figure 14:
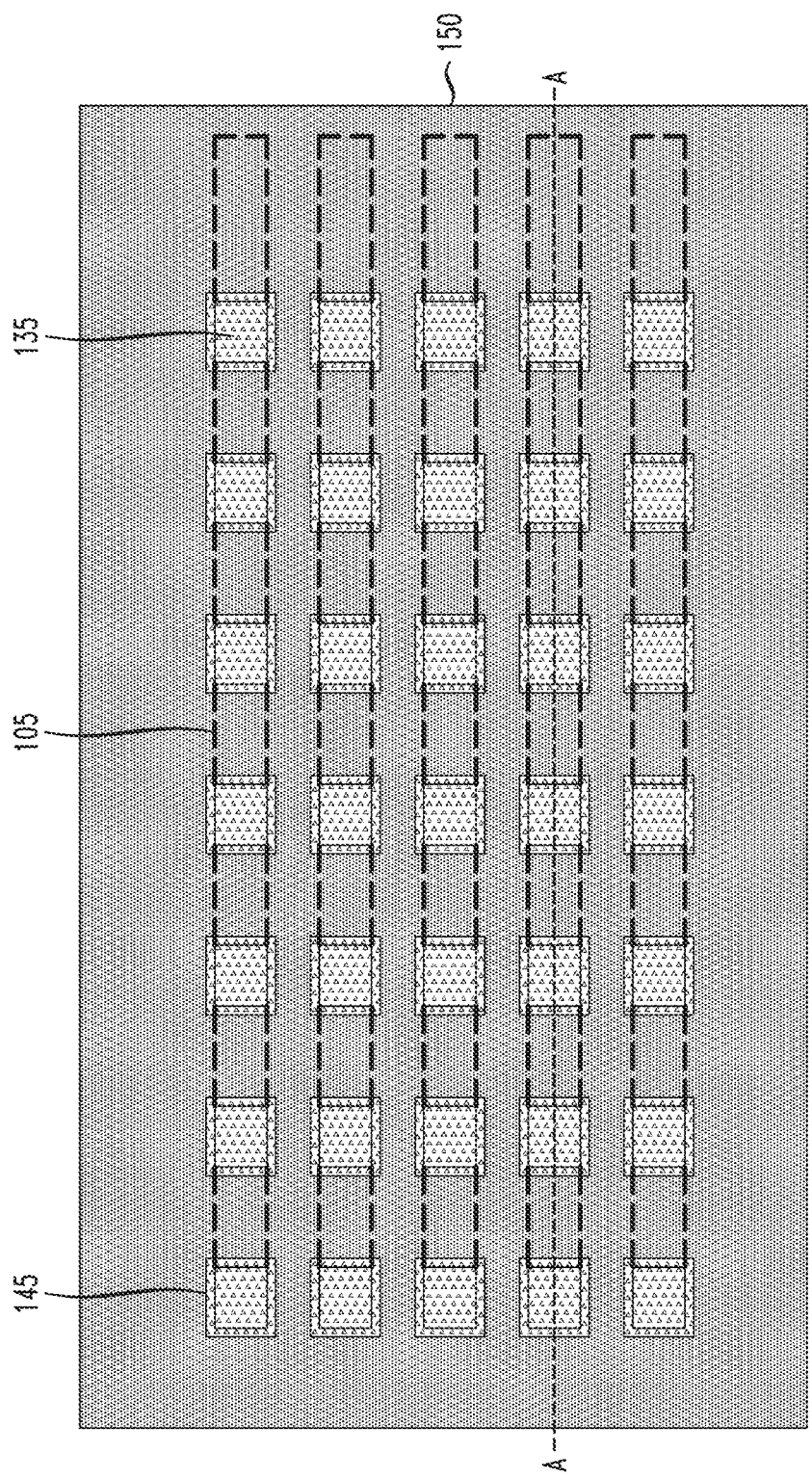
FIG. 14 is a schematic top view illustrating manufacturing of a memory device and showing formation of an extrinsic base layer, according to an embodiment of the invention.

FIG. 13 is a schematic cross-sectional view taken along the line A-A in the top view of FIG. 14. Referring to FIGS. 13 and 14, an extrinsic base layer 150 is formed on the structure of FIGS. 13 and 14. The extrinsic base layer 150 may comprise poly-SiGe or polysilicon. According to an embodiment, the extrinsic base layer 150 is formed by, deposition of a-Si, nc-Si, a-SiGe, μc-SiGe or nc-SiGe at about 400° C. or lower, using processes described with respect to the formation of the highly-doped collector layer 120, followed by recessing to a desired height, and conversion into polysilicon or poly-SiGe using a laser crystallization process. The recessing can be performed using, for example, a wet etch with, for example, tetramethylammonium hydroxide (TMAH) or dilute potassium hydroxide (KOH), or a dry etch with, for example, $SF_6/CHF_3$, $SF_6/O_2$ or $SF_6/CCl_2F_2$ plasma. The laser crystallization may be performed using the same conditions and procedures described with respect to the highly-doped collector layer 120.

According to another embodiment, the extrinsic base layer 150 is formed by a low temperature selective epitaxial growth process from the exposed sides of the base layer 115', at a temperature of about 400° C. or lower, e.g. such as about 150° C.-about 350° C. The low-temperature selective epitaxial growth may be performed using the same processes described with respect to the low-temperature epitaxial growth of the highly-doped collector layer 120, which results in epitaxial growth of polysilicon or poly-SiGe on the exposed sides of the base layer 115' and non-epitaxial growth of a-Si, nc-Si, a-SiGe, μc-SiGe or nc-SiGe on dielectric layers 142, 145 and 135 (not shown). The selective epitaxial growth is followed by a selective etch process to remove the non-epitaxial materials, leaving behind the extrinsic base layer 150. In one example, in-situ hydrogen plasma is used for selective removal of a-Si, a-SiGe, nc-Si, nc-SiGe, μc-Si or μc-SiGe with respect to polysilicon or poly-SiGe. By "in-situ" hydrogen plasma, it is meant that the hydrogen plasma etch is performed in the same chamber (reactor) as the growth chamber (reactor). In one example, the selective hydrogen plasma etch has an etch selectivity in the range of 3:1-10:1. The extrinsic base layer 150 formed by low-temperature selective epitaxial growth of polysilicon or poly-SiGe contains 5-40 atomic percent hydrogen. An optional low-energy laser treatment may follow to improve the crystallinity of the extrinsic base layer 150, as described with respect to collector layer 120.

The extrinsic base layer 150 has the same doping type/polarity (e.g., p) as the base layer 115', but is doped at a higher concentration than the base layers 115' (e.g., p+). According to an embodiment, a p+ doped extrinsic base layer 150 is doped with, for example, boron (B) at a total (i.e. active and/or inactive) concentration in the general range of $10^{20}/cm^3$-$10^{21}/cm^3$. According to an embodiment, the extrinsic base layer 150 has a wider band gap than that of the base layer 115'. The extrinsic base layer 150 may comprise the same material (e.g., poly-SiGe) as that of the base layer 115', or another material, such as, for example, polysilicon.

A vertical height of the extrinsic base layer 150 with respect to the underlying layer (e.g., spacer layer 142) on which the extrinsic base layer 150 is formed is about 5 nm-about 20 nm, but a thinner or thicker layer may be used as well. According to an embodiment, the extrinsic base layer 150 covers exposed sides of the base layers 115' and is formed on the spacer layer 142. The extrinsic base layer 150 may also be formed on lower end portions of the hanging spacer layers 145.

Figure 15:
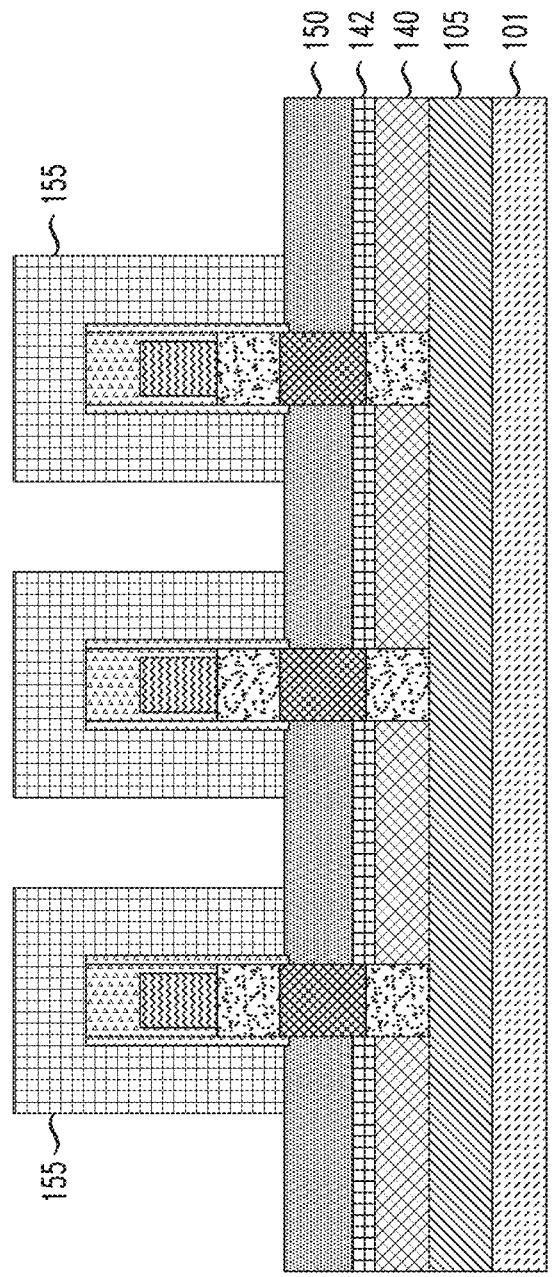
FIG. 15 is a schematic cross-sectional view taken along the line A-A in FIG. 17 illustrating manufacturing of a memory device and showing formation of extrinsic base masks, according to an embodiment of the invention.
Figure 16:
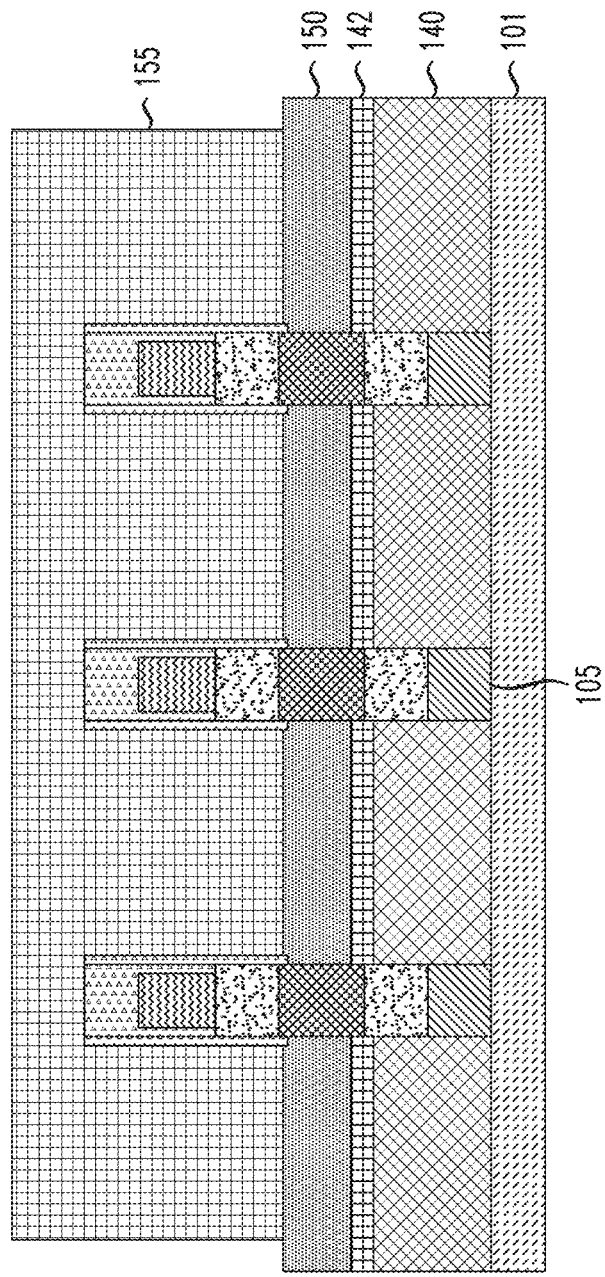
FIG. 16 is a schematic cross-sectional view taken along the line B-B in FIG. 17 illustrating manufacturing of a memory device and showing formation of an extrinsic base mask, according to an embodiment of the invention.
Figure 17:
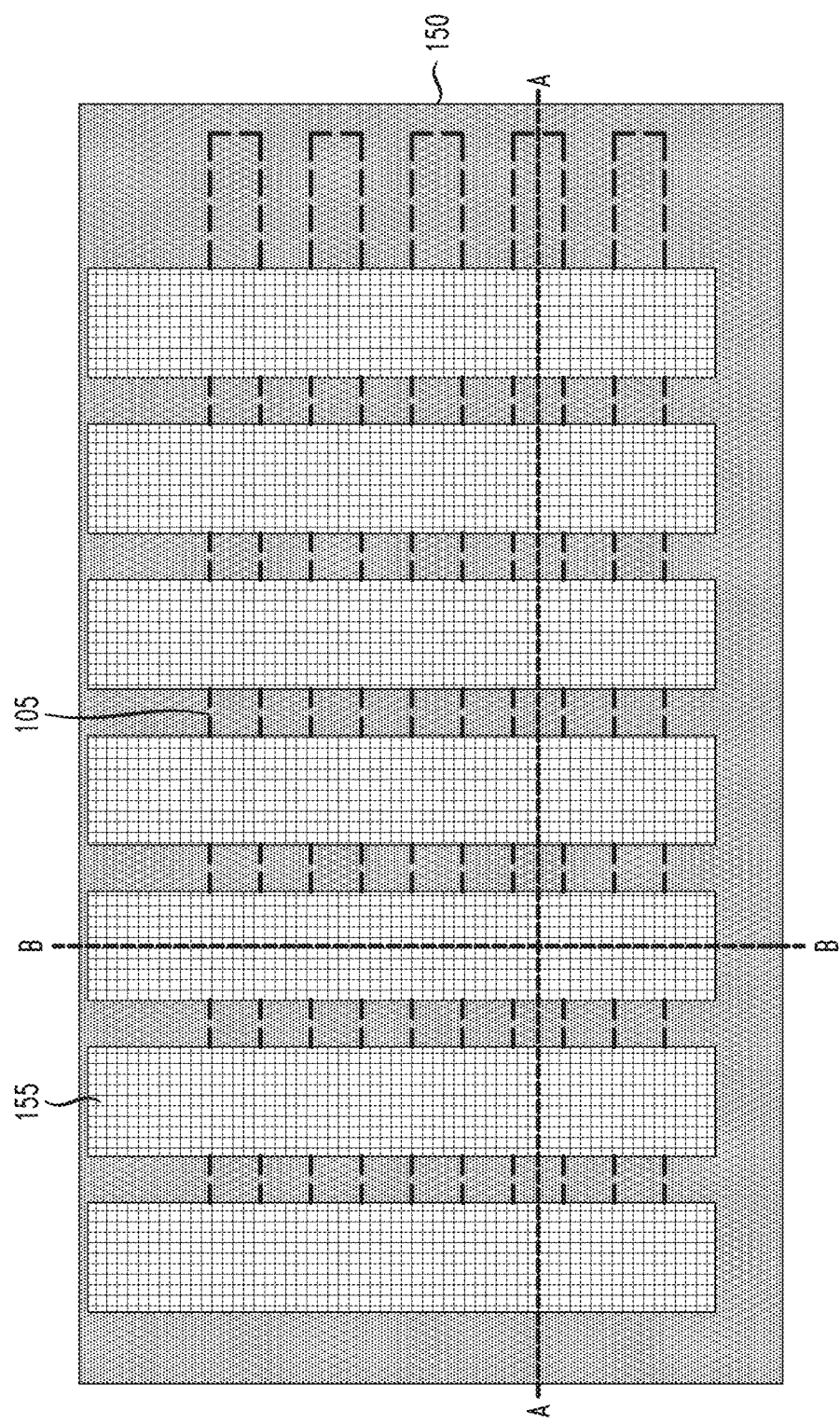
FIG. 17 is a schematic top view illustrating manufacturing of a memory device and showing formation of extrinsic base masks, according to an embodiment of the invention.

FIGS. 15 and 16 are schematic cross-sectional views taken along the line A-A and the line B-B, respectively in the top view of FIG. 17. Referring to FIGS. 15-17, extrinsic base masks 155 are formed on the pillars including the memory elements 130' and the collector layers 120', on the cap layers 135 and the hanging spacers 145, and on portions of the extrinsic base layer 150 adjacent the pillars. The masks 155 cover the portions of the extrinsic base layer 150 adjacent the pillars, and leave exposed remaining portions of the extrinsic base layer 150. The masks 155 can be deposited using, for example CVD, PECVD, RFCVD, HWCVD, PVD, ALD, MLD, MBD, PLD, LSMCD, and/or sputtering. According to one or more embodiments, the masks 155 are hardmasks comprising a dielectric material, such as, but not necessarily limited to, SiN or SiO.

Figure 18:
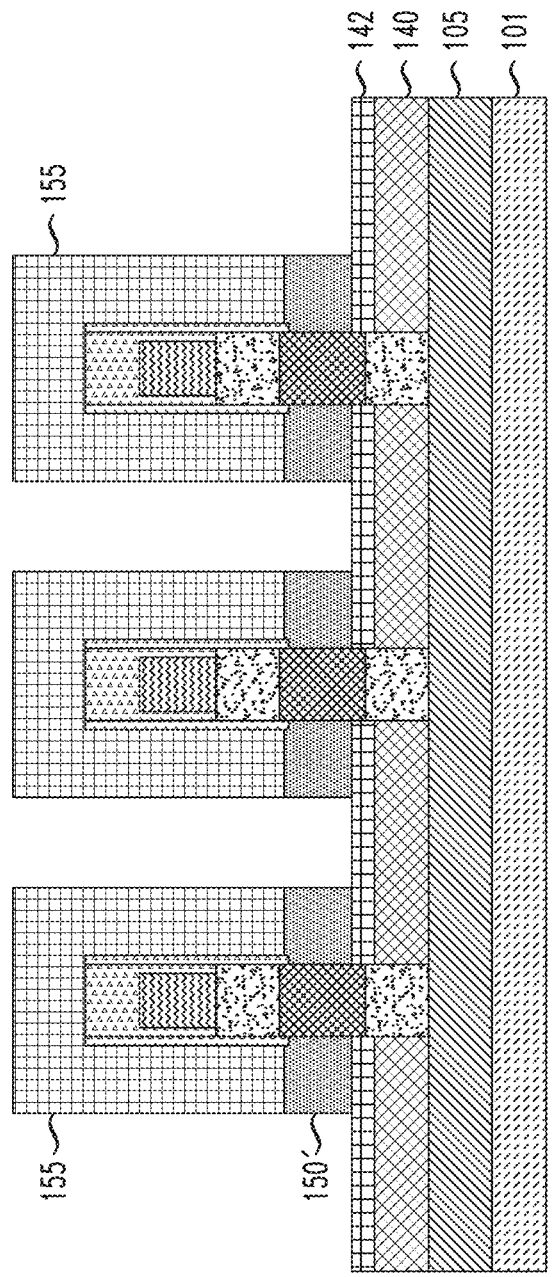
FIG. 18 is a schematic cross-sectional view taken along the line A-A in FIG. 20 illustrating manufacturing of a memory device and showing removal of exposed portions of the extrinsic base layer, according to an embodiment of the invention.
Figure 19:
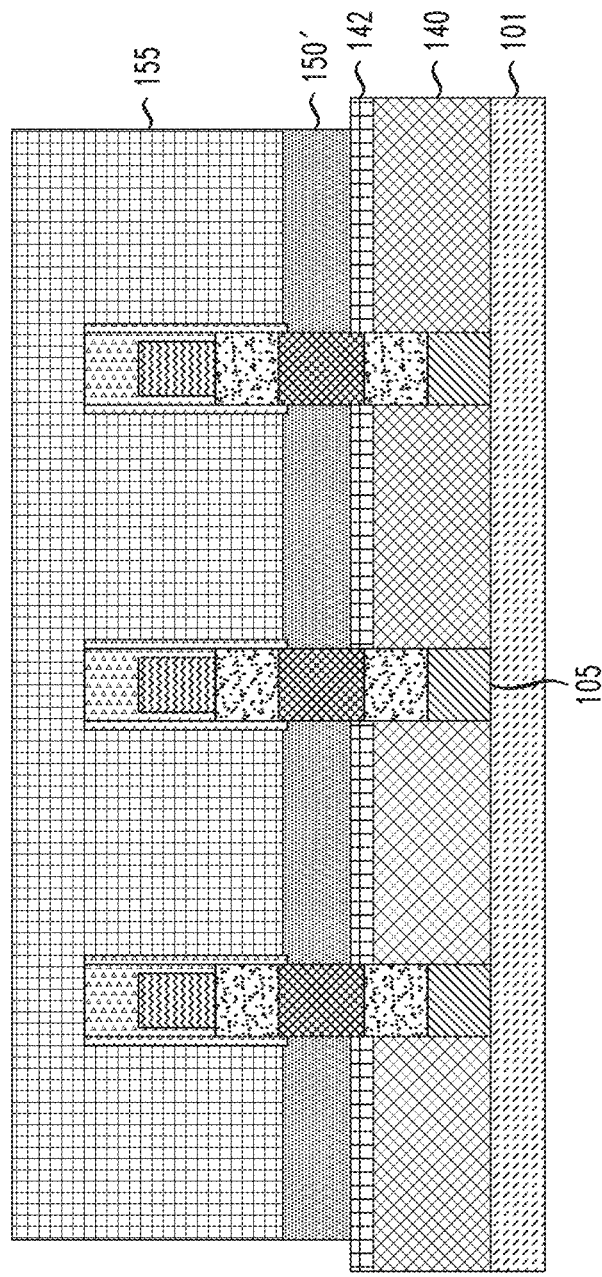
FIG. 19 is a schematic cross-sectional view taken along the line B-B in FIG. 20 illustrating manufacturing of a memory device and showing removal of exposed portions of the extrinsic base layer, according to an embodiment of the invention.
Figure 20:
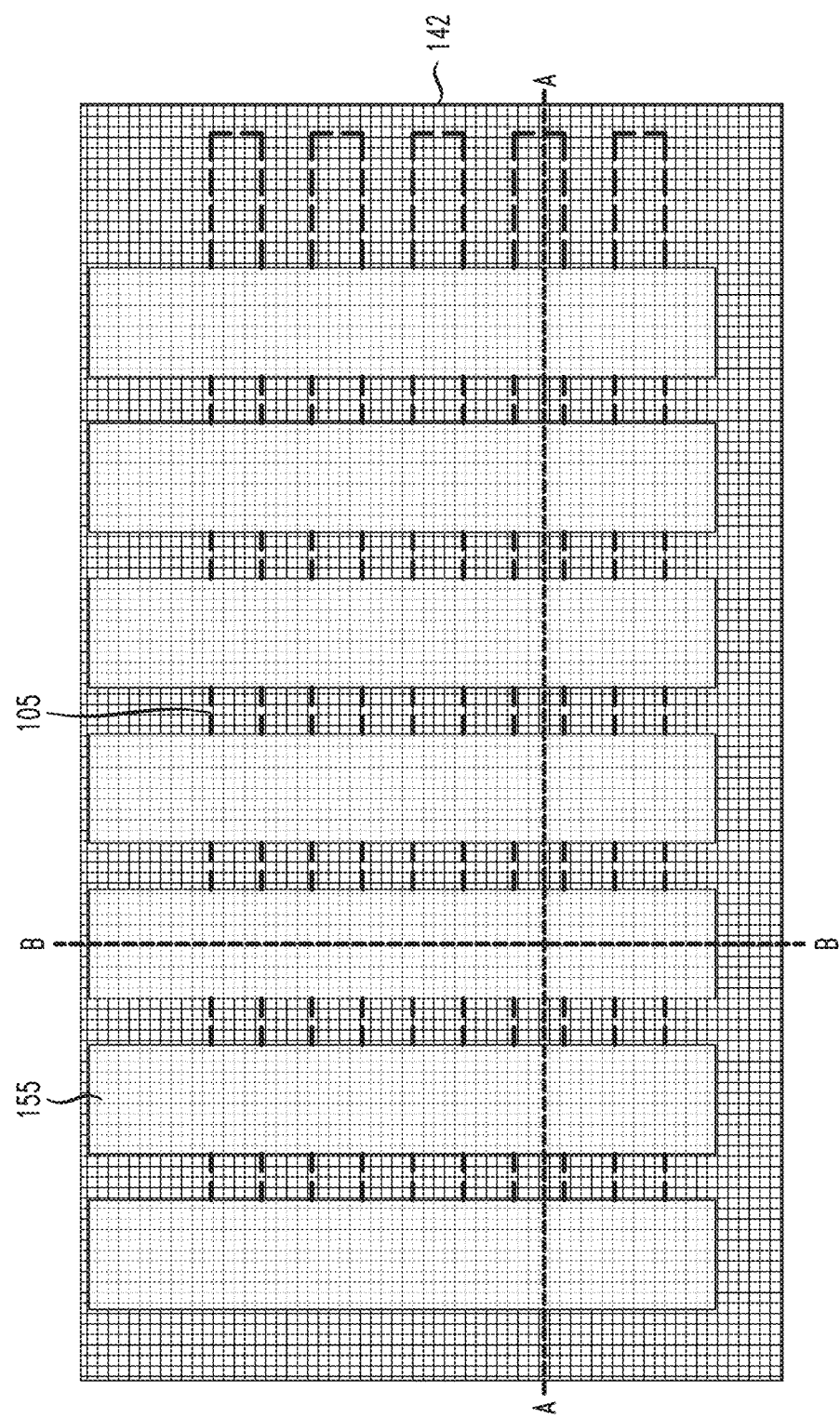
FIG. 20 is a schematic top view illustrating manufacturing of a memory device and showing removal of exposed portions of the extrinsic base layer, according to an embodiment of the invention.

FIGS. 18 and 19 are schematic cross-sectional views taken along the line A-A and the line B-B, respectively in the top view of FIG. 20. Referring to FIGS. 18-20, exposed portions of the extrinsic base layer 150 not covered by the masks 155 are removed using, for example, an etching process. According to an embodiment, the removal process is a RIE process using, for example, $SF_6/CHF_3$ plasma or $CF_4$ plasma, which removes the exposed portions of the extrinsic base layer 150, and exposes the underlying portions of the spacer layer 142. The remaining patterned portions of the extrinsic base layer 150' are under the masks 155. Referring to FIGS. 19 and 20, the patterned portions of the extrinsic base layer 150' electrically connect multiple pillars including memory elements 130' and BJT devices along the vertical direction in FIG. 20 (e.g., line B-B). Referring to FIGS. 18 and 20, where there are breaks in the patterned portions of the extrinsic base layer 150', the patterned portions of the extrinsic base layer 150' do not electrically connect the pillars along the horizontal direction in FIG. 20 (e.g., line A-A).

Figure 21:
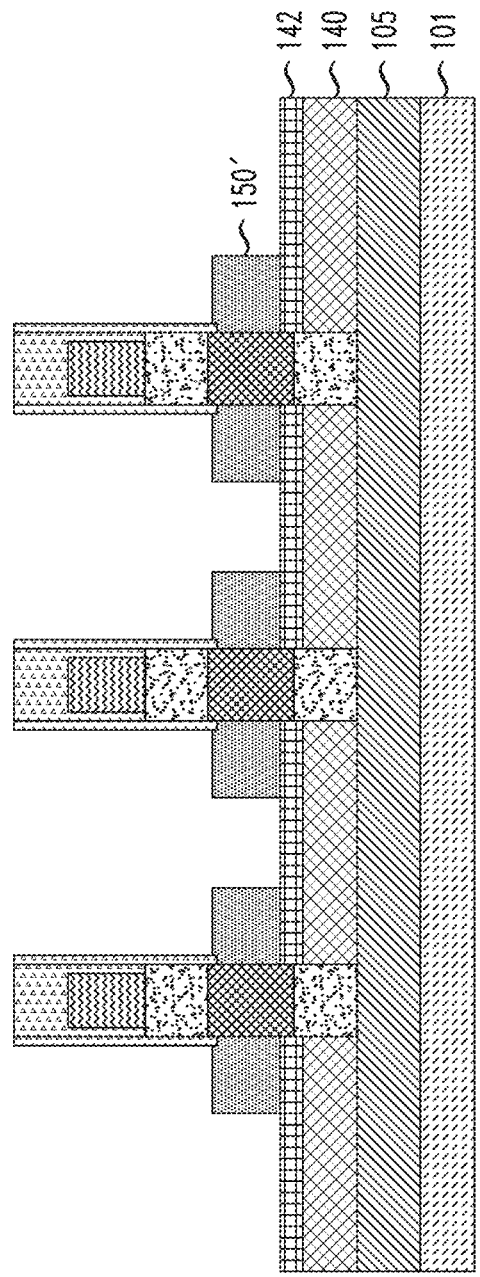
FIG. 21 is a schematic cross-sectional view taken along the line A-A in FIG. 23 illustrating manufacturing of a memory device and showing mask removal, according to an embodiment of the invention.
Figure 22:
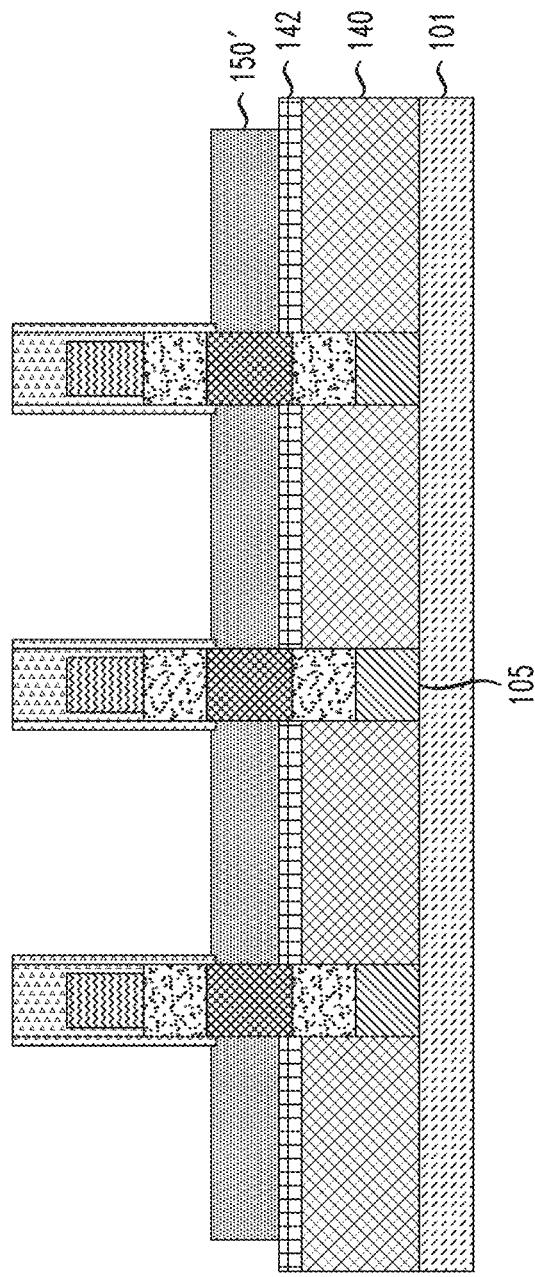
FIG. 22 is a schematic cross-sectional view taken along the line B-B in FIG. 23 illustrating manufacturing of a memory device and showing mask removal, according to an embodiment of the invention.
Figure 23:
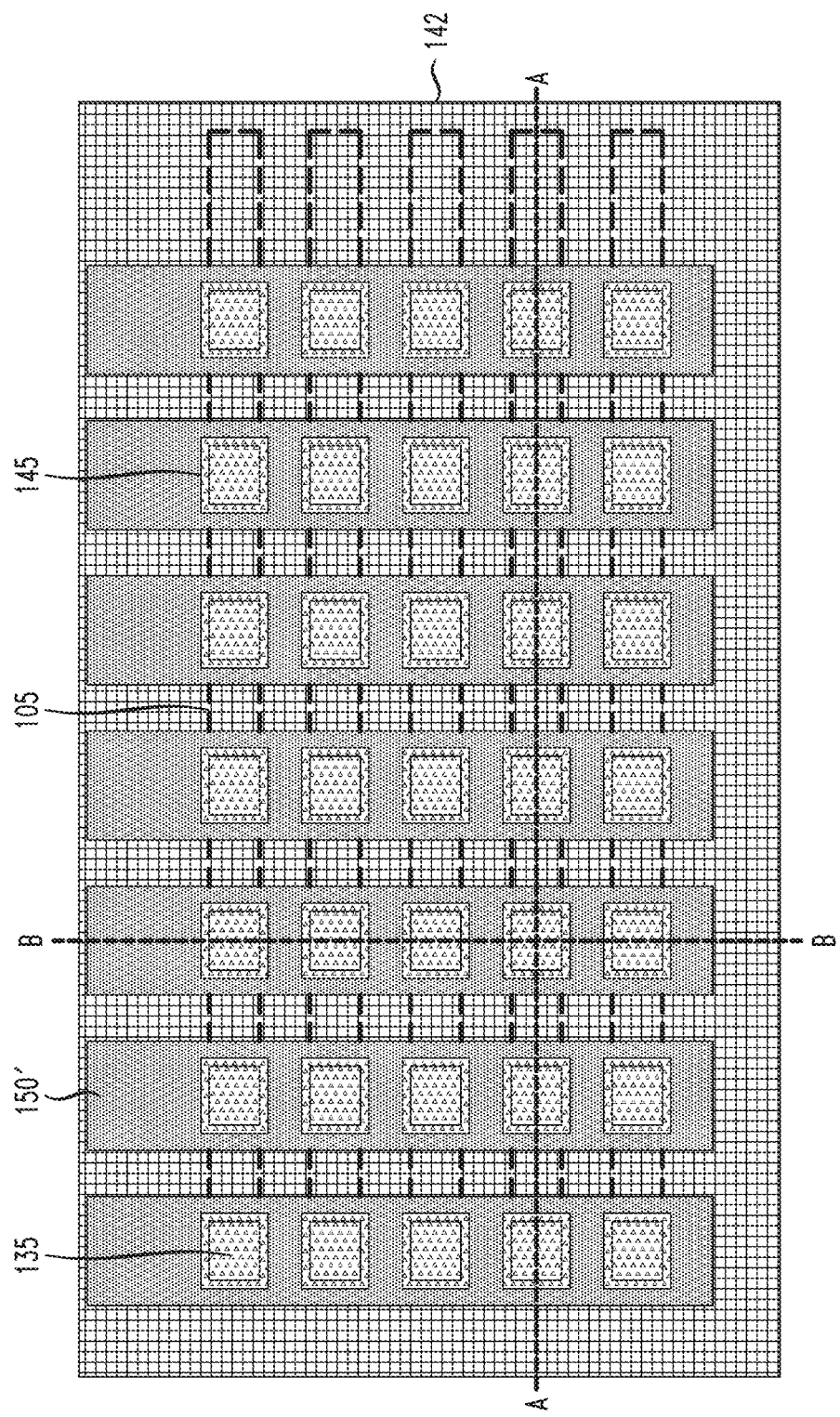
FIG. 23 is a schematic top view illustrating manufacturing of a memory device and showing mask removal, according to an embodiment of the invention.

FIGS. 21 and 22 are schematic cross-sectional views taken along the line A-A and the line B-B, respectively in the top view of FIG. 23. Referring to FIGS. 21-23, the masks 155 are removed from on top of the patterned portions of the extrinsic base layer 150', and from on top of the pillars including the cap layers 135 and the hanging spacers 145. According to an embodiment, the masks 155 are removed using a wet etch such as with buffered hydrofluoric acid or a plasma etch such as with $CF_4/O_2$. As can be seen in FIG. 23, the patterned portions of the extrinsic base layer 150' connect the pillars along the vertical direction (e.g., line B-B), but not along the horizontal direction (e.g., line A-A).

Figure 24:
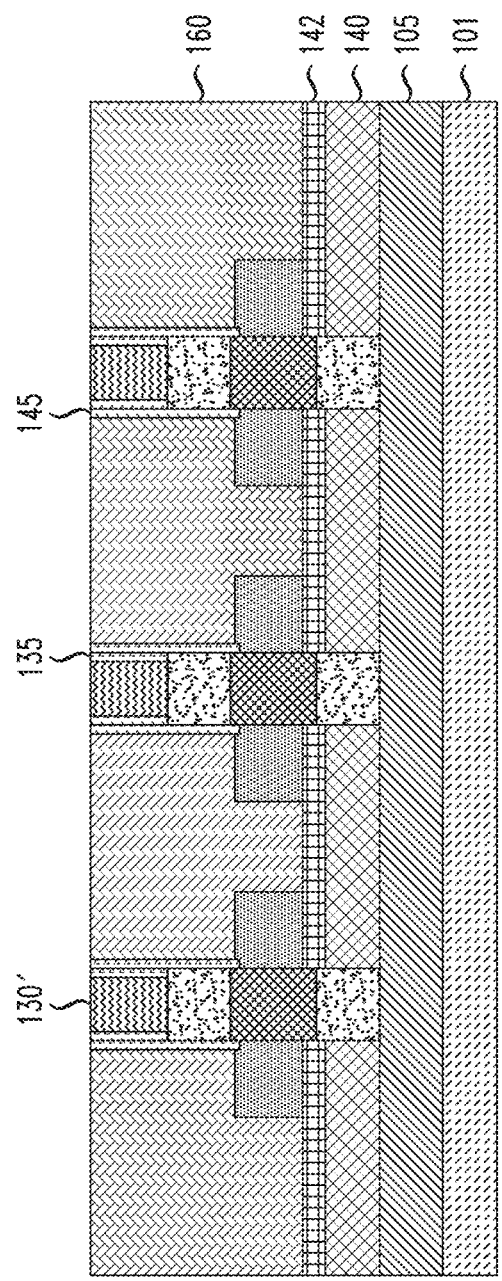
FIG. 24 is a schematic cross-sectional view taken along the line A-A in FIG. 26 illustrating manufacturing of a memory device and showing inter-layer dielectric (ILD) layer formation and planarization, according to an embodiment of the invention.
Figure 25:
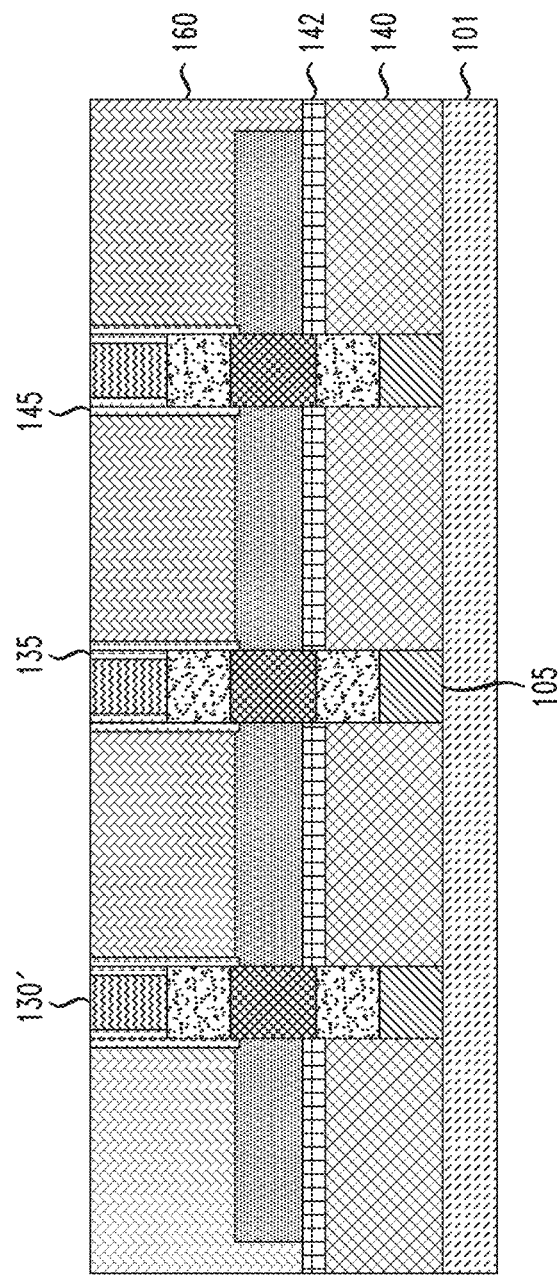
FIG. 25 is a schematic cross-sectional view taken along the line B-B in FIG. 26 illustrating manufacturing of a memory device and showing ILD layer formation and planarization, according to an embodiment of the invention.
Figure 26:
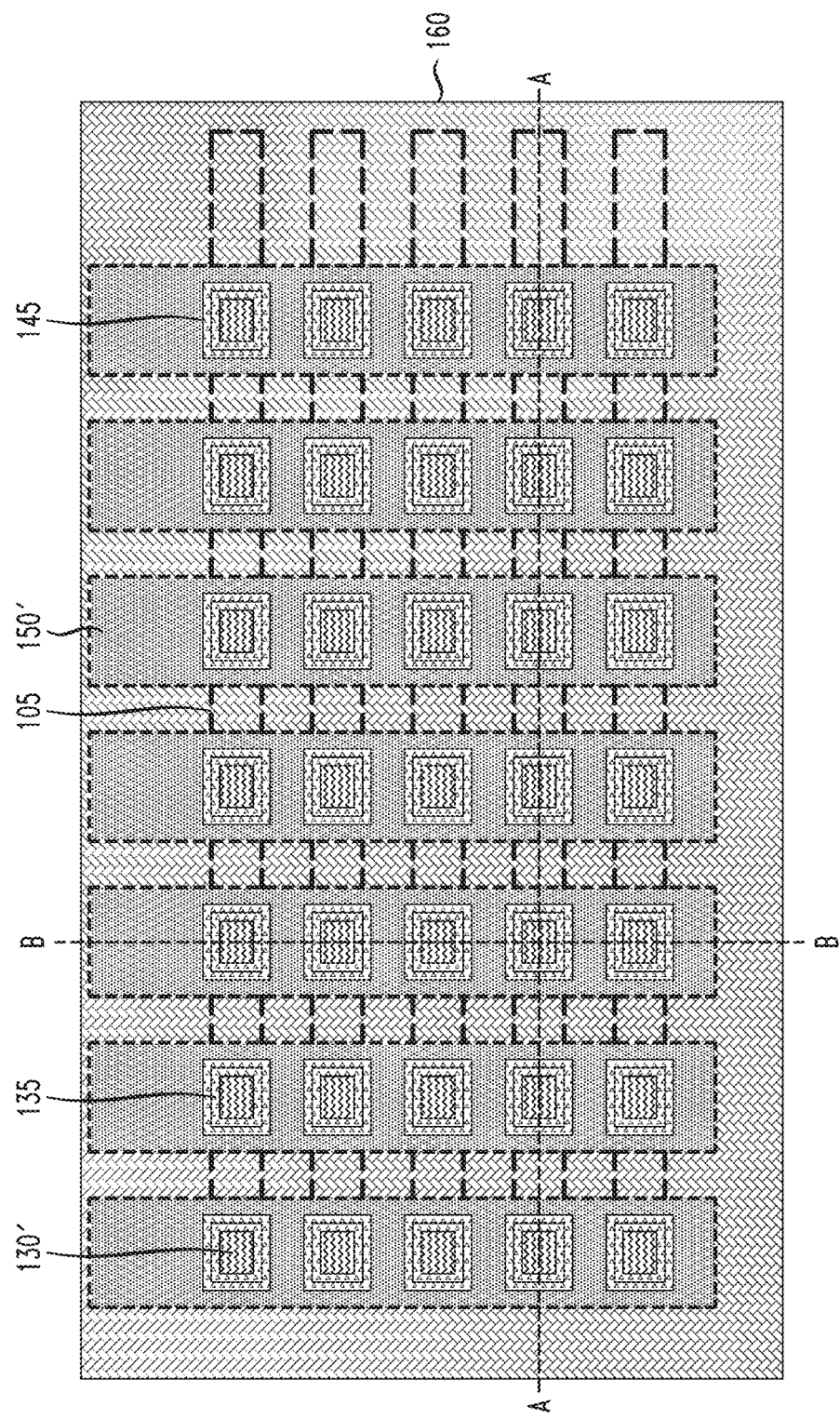
FIG. 26 is a schematic top view illustrating manufacturing of a memory device and showing ILD layer formation and planarization, according to an embodiment of the invention.

FIGS. 24 and 25 are schematic cross-sectional views taken along the line A-A and the line B-B, respectively in the top view of FIG. 26. Referring to FIGS. 24-25, an ILD layer 160 is deposited on the exposed portions of the spacer layer 142, the patterned portions of the extrinsic base layer 150' and on and around the pillars including the cap layers 135, hanging spacers 145, memory elements 130' and underlying BJT layers 120'. 115' and 110'. The ILD layer 160 fills in areas on the spacer layer 142 and patterned extrinsic base layers 150' between the pillars. The material of the ILD layer 160 can include, but is not necessarily limited to, a low-K dielectric material, such as, for example, silicon oxide, SiN, SiON, BN, and/or SiBN. The dielectric layer 160 is deposited using deposition techniques such as, for example, CVD, PECVD, RFCVD, PVD, ALD, MBD, PLD, LSMCD, and/or sputtering, which is followed by a planarization process, such as, CMP, down to the memory elements 130', exposing the top surfaces of the memory elements 130'. The planarization removes upper portions of the cap layers 135, portions of the hanging spacers 145 on the upper portions of the cap layers 135, and excess portions of the ILD layer 160 to result in the structure shown in FIGS. 24-26. In FIG. 26, the patterned portions of the extrinsic base layer 150' are outlined in dotted lines to illustrate the presence of the patterned portions of the extrinsic base layer 150' under the ILD layer 160. In general, in the top views, elements outlined by dotted lines (e.g., select lines 105) are hidden by overlying layers.

Figure 27:
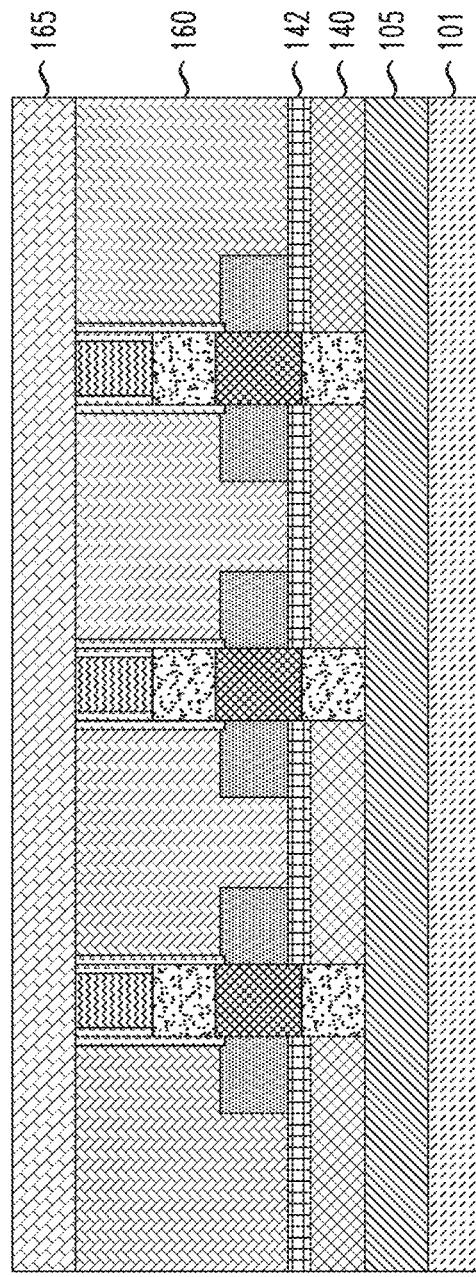
FIG. 27 is a schematic cross-sectional view taken along the line A-A in FIG. 29 illustrating manufacturing of a memory device and showing top conductive crossbar formation, according to an embodiment of the invention.
Figure 28:
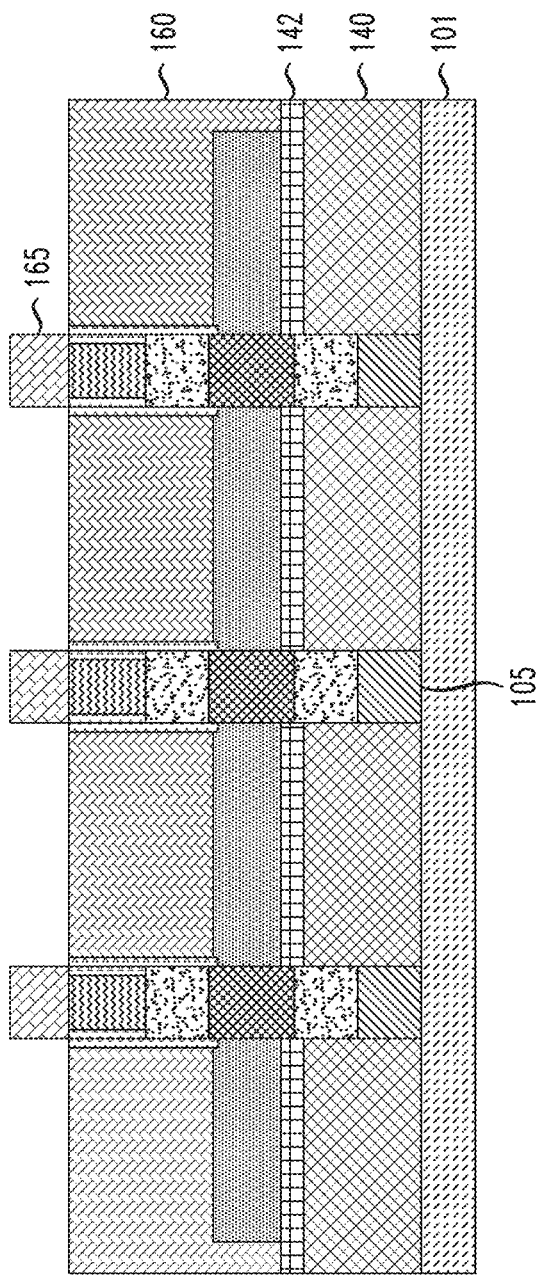
FIG. 28 is a schematic cross-sectional view taken along the line B-B in FIG. 29 illustrating manufacturing of a memory device and showing top conductive crossbar formation, according to an embodiment of the invention.
Figure 29:
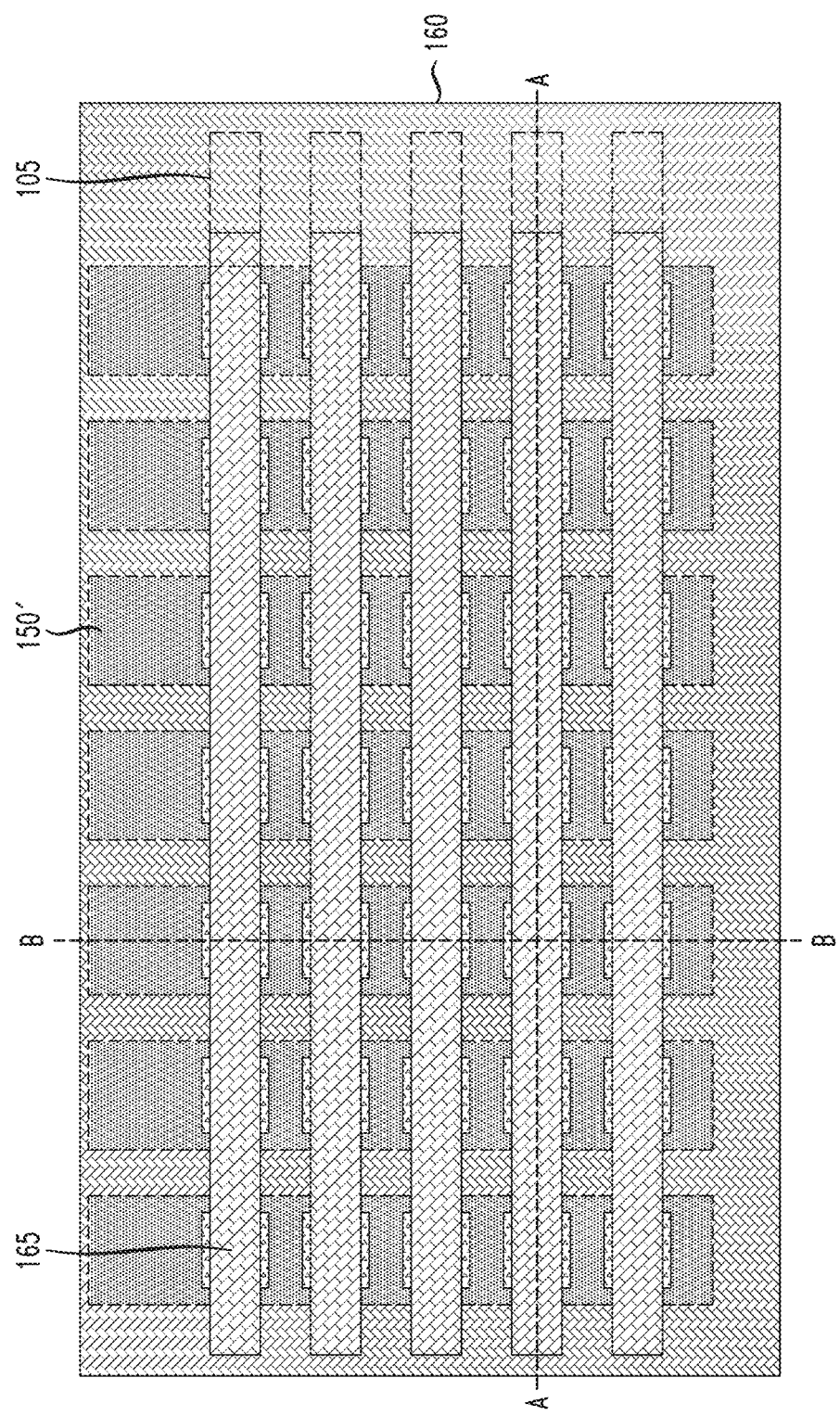
FIG. 29 is a schematic top view illustrating manufacturing of a memory device and showing top conductive crossbar formation, according to an embodiment of the invention.

FIGS. 27 and 28 are schematic cross-sectional views taken along the line A-A and the line B-B, respectively in the top view of FIG. 29. Referring to FIGS. 27-28, top conductive crossbars (also referred to herein as "bitlines") are formed on the structure of FIGS. 24-26 to contact the memory elements 130'. A plurality of bitlines 165 are formed on the ILD layer 160 to be spaced apart from each other in positions corresponding to the pillars including layers 130', 120' and 110'. The bitlines 165 physically and electrically contact their corresponding memory elements 130'.

As can be seen in the top view of FIG. 29, the bitlines 165 are oriented to have a length (longer dimension) extension direction in the horizontal direction in FIG. 29. In order to form a cross-point memory structure, the plurality of bitlines are perpendicular to the plurality of wordlines. In this case, the wordlines are the extrinsic base layer portions 150', which have a length (longer dimension) extension direction in the vertical direction in FIG. 29.

The material of the bitlines 165 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bitlines 165 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bitline layer is deposited and then patterned into individual portions that are spaced apart from each other. The bitlines 165 can be patterned to be spaced apart from each other, using, for example, photolithography and ME, which may optionally include a dielectric hard mask such as an oxide or nitride.

Figure 30:
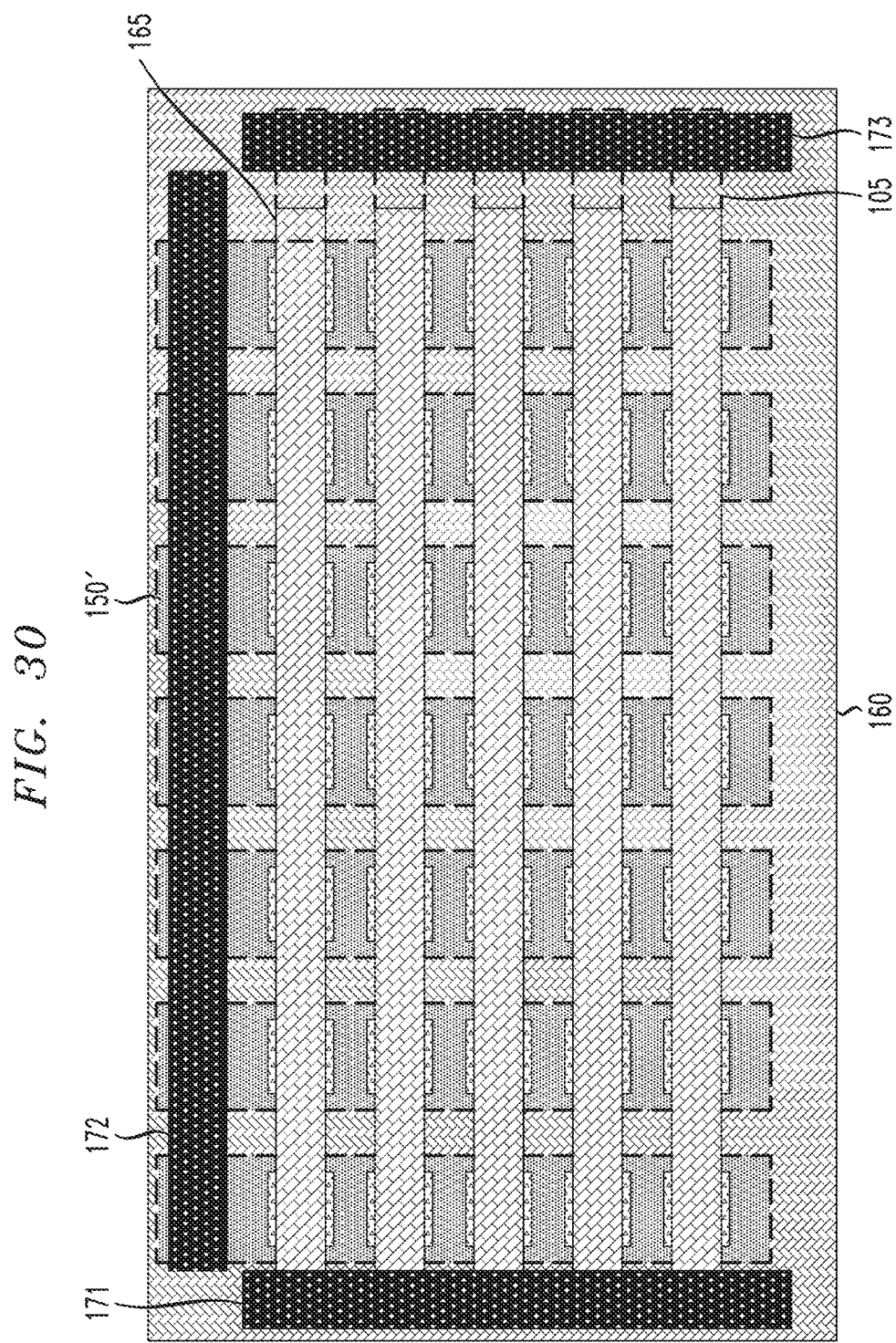
FIG. 30 is a schematic top view illustrating manufacturing of a memory device and showing formation of contacts to individual select lines, individual bitlines and individual wordlines, according to an embodiment of the invention.

Referring to FIG. 30, an individual select line contact region 173 having contacts to respective individual select lines 105, an individual bit-line contact region 171 with contacts to respective individual bitlines 165 and an individual extrinsic base access contact region 172 with contacts to respective individual wordlines (e.g., extrinsic base layer portions 150') are formed. In embodiments comprised of a common select line (not shown) instead of a plurality of select lines 105, a common select line contact region is formed similarly to individual select line contact region 173, except with a contact to the common select line. The contacts may be formed in trenches in a dielectric layer by filling the trenches with contact material, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trenches before filling the trenches with the contact material layers. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Stacked structures of the memory device shown in FIGS. 27-29 may be formed by adding another ILD layer on the ILD layer 160 to cover the bitlines 165, and then repeating the processing described in connection with FIGS. 1-29, and forming contacts for the stacked structure in accordance with the processing described in connection with FIG. 30. Two or more memory devices of the type shown in FIGS. 27-29 may be stacked on each other.

Figure 31:
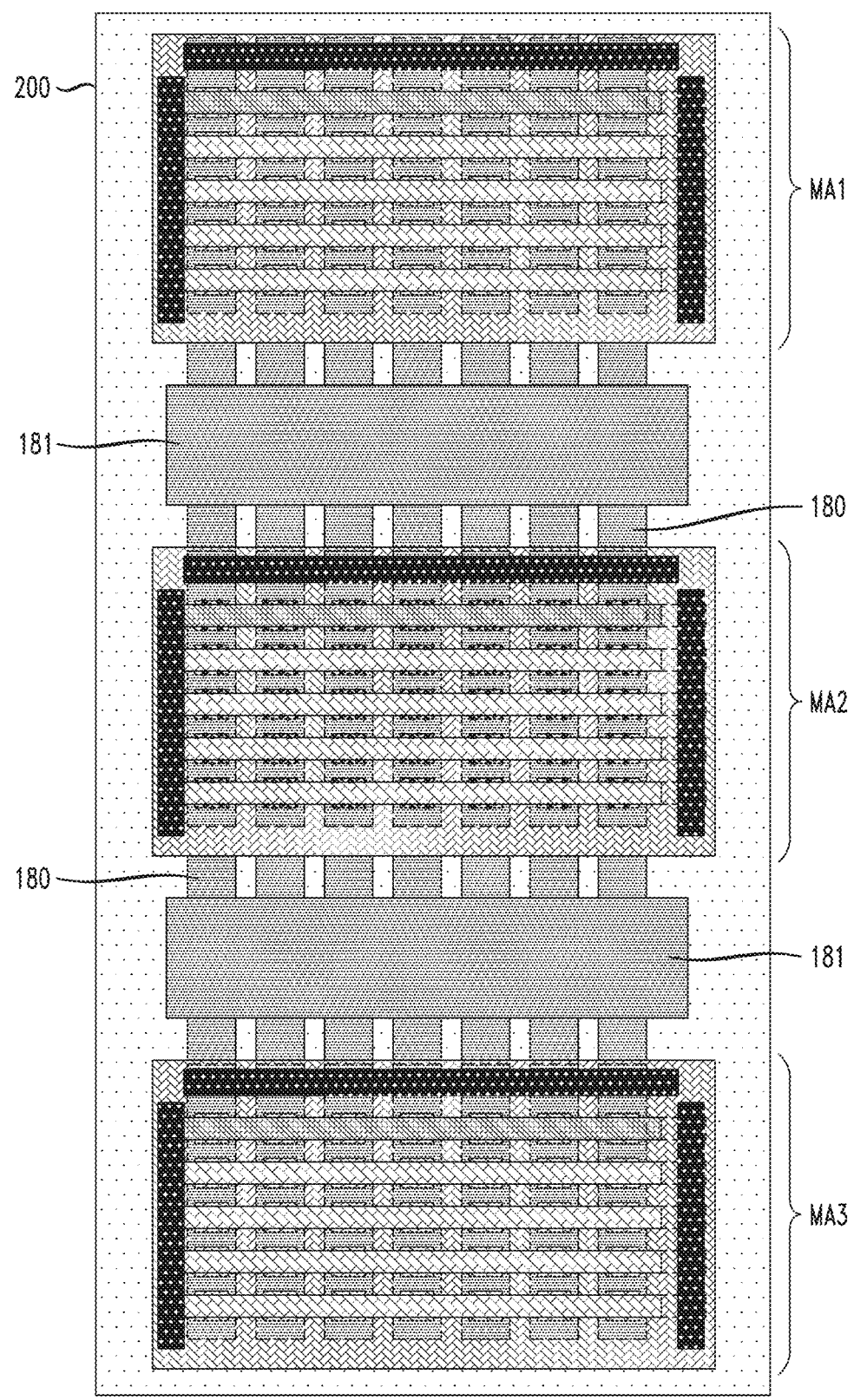
FIG. 31 is a top view illustrating poly-lines and poly-pads connecting extrinsic bases of multiple memory arrays, according to an embodiment of the invention.
Figure 32:
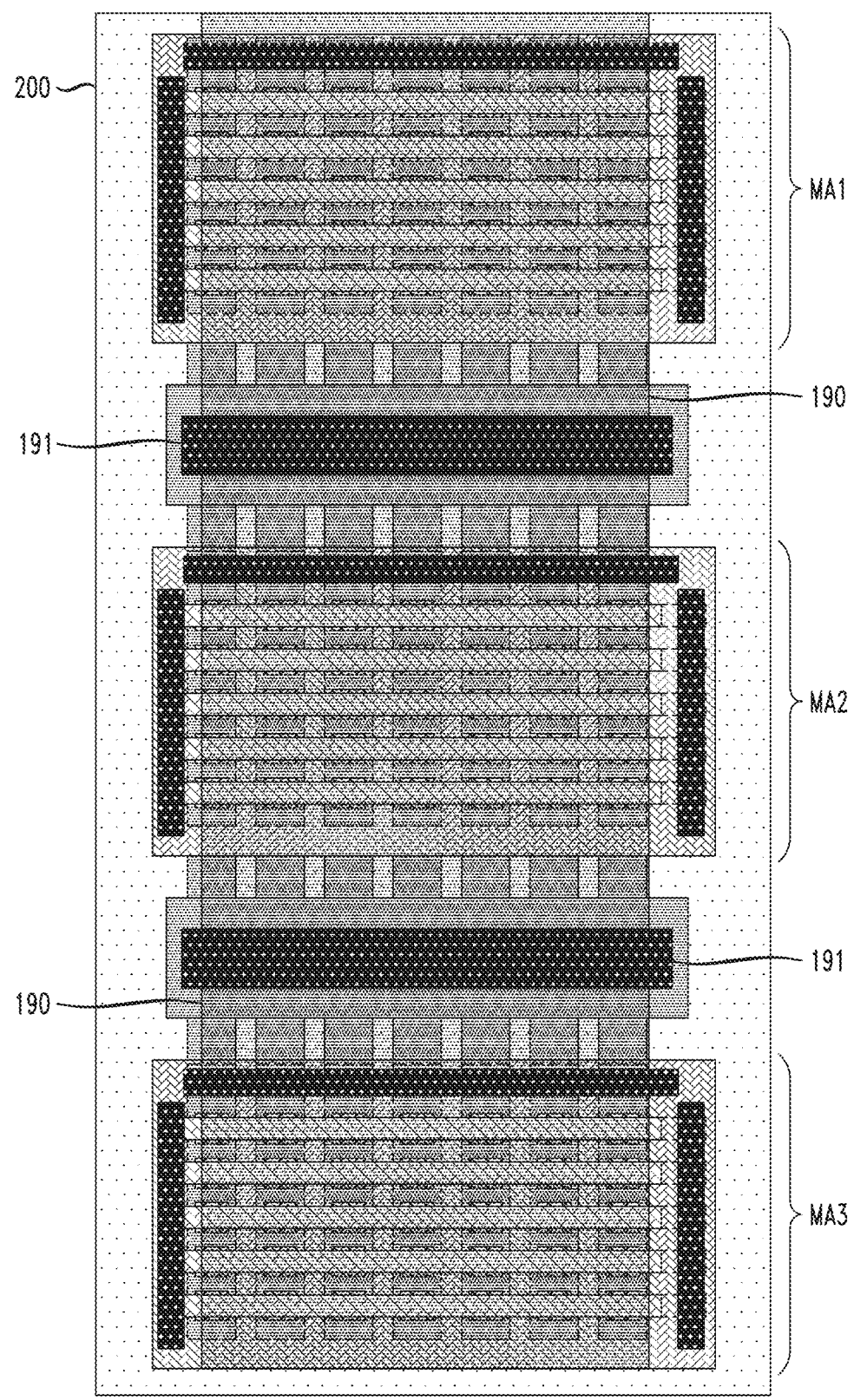
FIG. 32 is a top view illustrating a conductive line and connecting vias to poly-pads and poly-lines connecting extrinsic bases of multiple memory arrays, according to an embodiment of the invention.
Figure 33:
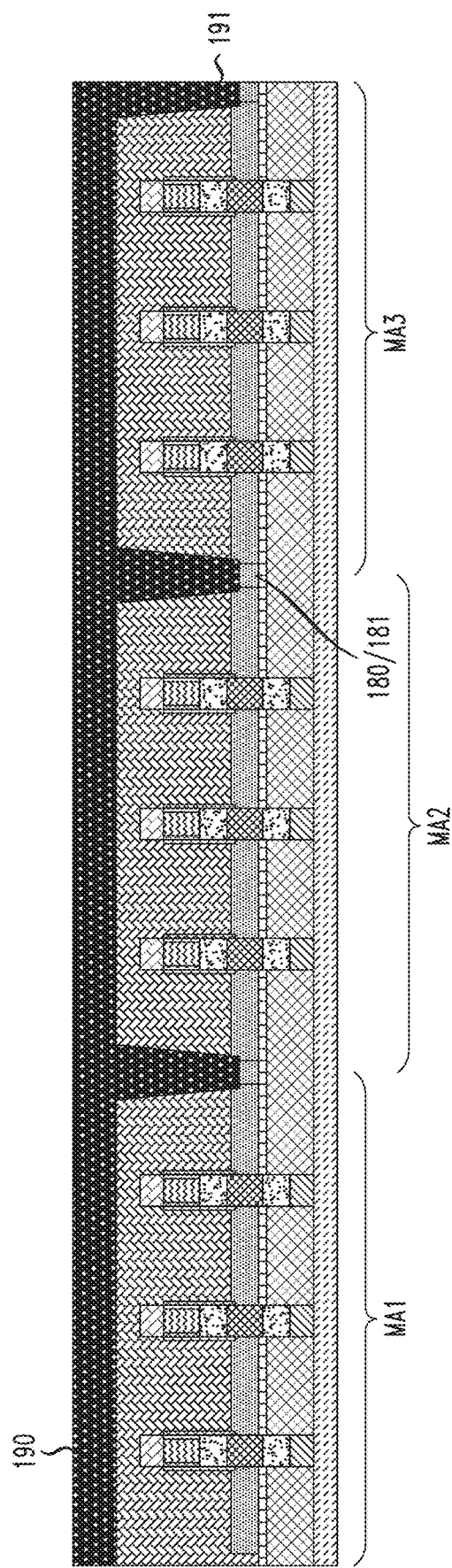
FIG. 33 is a cross-sectional view illustrating a conductive line and connecting vias to poly-pads and poly-lines connecting extrinsic bases of multiple memory arrays, according to an embodiment of the invention.

Referring to FIGS. 31-33, in order to reduce lateral resistance of poly-lines 180 connecting the extrinsic bases 150' of multiple memory arrays (e.g., MA1, MA2 and MA3) formed on a substrate 200, a stitched conductive line 190 is formed on top of the poly-lines 180 including poly-pads 181 on the poly-lines 180. The poly-lines 180 and poly-pads comprise, for example, polysilicon. Connecting vias 191 extend from the conductive line 190 to the poly-pads 181 formed on the poly-lines 180. The conductive line 190 and connecting vias 191 comprise the same or similar material as the contacts discussed in connection with FIG. 30. The conductive line 190 is formed on an ILD layer formed over the pillars and bitlines 165.

According to an embodiment, global row decoders connect to multiple arrays through metal wordline straps. The straps are stitched to polysilicon wordlines at specific intervals dictated by the polysilicon resistance and a desired resistor-capacitor (RC) wordline time constant. Processes that strap wordlines with metal do not silicide the polysilicon, although doing so would reduce the number of stitch regions required. Strapping wordlines and using global row decoders reduces die size.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:

forming a first doped semiconductor layer on a conductive layer;

forming a second doped semiconductor layer stacked on the first doped semiconductor layer;

forming a third doped semiconductor layer stacked on the second doped semiconductor layer;

forming a memory stack layer on the third doped semiconductor layer;

patterning the memory stack layer and the first, second and third doped semiconductor layers into a plurality of pillars spaced apart from each other; and forming a plurality of extrinsic base layers adjacent the patterned second doped semiconductor layer in each pillar of the plurality of pillars;

wherein forming the plurality of extrinsic base layers comprises epitaxially growing the plurality of extrinsic base layers from the patterned second doped semiconductor layer in each pillar of the plurality of pillars;

wherein the patterned first, second and third doped semiconductor layers in each pillar of the plurality of pillars are components of a bipolar junction transistor device; and wherein the plurality of pillars are parts of a memory cell array having a cross-point structure.

2. The method according to claim 1, wherein the plurality of extrinsic base layers have the same doping type as the patterned second doped semiconductor layers and are doped at a higher concentration than the patterned second doped semiconductor layers.

3. The method according to claim 1, wherein the first doped semiconductor layer comprises a semiconductor material having a wider bandgap than a semiconductor material of the second doped semiconductor layer.

4. The method according to claim 1, further comprising covering the patterned doped third semiconductor layer in each pillar of the plurality of pillars with hanging spacers prior to forming the plurality of extrinsic base layers.

5. The method according to claim 1, wherein respective ones of the plurality of extrinsic base layers connect a group of the plurality of pillars along a first direction.

6. The method according to claim 5, further comprising forming a plurality of bitlines extending perpendicular to the first direction, wherein the plurality of bitlines contact the patterned portions of the memory stack layer in each pillar.

7. The method according to claim 1, wherein:

the patterned first doped semiconductor layer of each pillar of the plurality of pillars is an emitter of a bipolar junction transistor device;

the patterned second doped semiconductor layer of each pillar of the plurality of pillars is a base of a bipolar junction transistor device; and the patterned third doped semiconductor layer of each pillar of the plurality of pillars is a collector of a bipolar junction transistor device.

8. The method according to claim 1, wherein forming the first, second and third doped semiconductor layers comprises performing a laser annealing process to transform first, second and third semiconductor layers into one or more of polysilicon and poly-silicon germanium.

9. A semiconductor memory device, comprising:

a plurality of stacked structures spaced apart from each other and formed on a plurality of select lines;

wherein each of the plurality of stacked structures comprises:

a first doped semiconductor layer on a select line of the plurality of select lines;

a second doped semiconductor layer stacked on the first doped semiconductor layer;

a third doped semiconductor layer stacked on the second doped semiconductor layer; and a memory element stacked on the third doped semiconductor layer;

a plurality of extrinsic base layers extending from the second doped semiconductor layers; and a plurality of hanging spacers on lateral sides of at least the third doped semiconductor layer of each of the plurality of stacked structures;

wherein the first, second and third doped semiconductor layers in each stacked structure of the plurality of stacked structures are components of a bipolar junction transistor device; and wherein the plurality of stacked structures are parts of a memory cell array having a cross-point structure.

10. The semiconductor memory device according to claim 9, wherein:

the first doped semiconductor layer in each stacked structure comprises polysilicon; and the second doped semiconductor layer in each stacked structure comprises one of polysilicon and poly-silicon germanium.

11. The semiconductor memory device according to claim 9, wherein:

the first and third doped semiconductor layers in each stacked structure have a first doping type; and the second doped semiconductor layer in each stacked structure has a second doping type different from the first doping type.

12. The semiconductor device according to claim 9, wherein the plurality of extrinsic base layers have the same doping type as the second doped semiconductor layers and are doped at a higher concentration than the second doped semiconductor layers.

13. The semiconductor device according to claim 9, wherein respective ones of the plurality of extrinsic base layers connect a group of the plurality of stacked structures along a first direction.

14. The semiconductor device according to claim 13, further comprising a plurality of bitlines contacting the memory elements of the plurality of stacked structures, wherein the plurality of bitlines extend perpendicular to the first direction.

15. A semiconductor memory device, comprising:

a plurality of stacked structures spaced apart from each other and formed on a plurality of select lines;

wherein each of the plurality of stacked structures comprises:

a first doped semiconductor layer on a select line of the plurality of select lines;

a second doped semiconductor layer stacked on the first doped semiconductor layer;

a third doped semiconductor layer stacked on the second doped semiconductor layer; and a memory element stacked on the third doped semiconductor layer; and a plurality of epitaxially-grown extrinsic base layers extending from the second doped semiconductor layers;

wherein the first, second and third doped semiconductor layers in each stacked structure of the plurality of stacked structures are components of a bipolar junction transistor device; and wherein the plurality of stacked structures are parts of a memory cell array having a cross-point structure.

16. The semiconductor memory device according to claim 15, wherein:

the first doped semiconductor layer in each stacked structure comprises polysilicon; and the second doped semiconductor layer in each stacked structure comprises one of polysilicon and poly-silicon germanium.

17. The semiconductor memory device according to claim 15, wherein:

the first and third doped semiconductor layers in each stacked structure have a first doping type; and the second doped semiconductor layer in each stacked structure has a second doping type different from the first doping type.

18. The semiconductor device according to claim 15, wherein the plurality of extrinsic base layers have the same doping type as the second doped semiconductor layers and are doped at a higher concentration than the second doped semiconductor layers.

19. The semiconductor device according to claim 15, wherein respective ones of the plurality of extrinsic base layers connect a group of the plurality of stacked structures along a first direction.

20. The semiconductor device according to claim 19, further comprising a plurality of bitlines contacting the memory elements of the plurality of stacked structures, wherein the plurality of bitlines extend perpendicular to the first direction.

* * * * *